(12) United States Patent
Holmes et al.

(10) Patent No.: US 6,970,490 B2
(45) Date of Patent: Nov. 29, 2005

(54) ORGANIC LIGHT EMITTING DEVICES BASED ON THE FORMATION OF AN ELECTRON-HOLE PLASMA

(75) Inventors: Russell James Delmar Holmes, Princeton, NJ (US); Marc A. Baldo, Cambridge, MA (US); Stephen R. Forrest, Princeton, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 338 days.

(21) Appl. No.: 10/143,354

(22) Filed: May 10, 2002

(65) Prior Publication Data

US 2003/0209972 A1 Nov. 13, 2003

(51) Int. Cl.⁷ ................................................. H01S 5/00
(52) U.S. Cl. ...................... 372/43; 372/39; 372/43; 372/44; 372/45; 372/46; 372/47; 372/48; 372/49; 372/50; 257/87; 257/89; 257/90; 257/96; 257/98; 257/100; 257/103; 257/184; 257/40; 257/13; 313/501; 313/503; 313/506; 313/507
(58) Field of Search .............................. 372/39, 43–50; 257/87–90, 96, 100, 103, 184, 40, 13, 98; 313/501, 503, 506, 507

(56) References Cited

U.S. PATENT DOCUMENTS

| | | | | |
|---|---|---|---|---|
| 3,816,196 A | * | 6/1974 | La Combe | 216/67 |
| 3,816,198 A | * | 6/1974 | La Combe et al. | 216/71 |
| 5,371,817 A | * | 12/1994 | Revelli et al. | 385/44 |
| 5,580,523 A | * | 12/1996 | Bard | 422/50 |
| 5,881,089 A | * | 3/1999 | Berggren et al. | 372/96 |
| 6,097,147 A | * | 8/2000 | Baldo et al. | 313/506 |
| 6,124,964 A | * | 9/2000 | Imanishi et al. | 359/248 |
| 6,300,612 B1 | * | 10/2001 | Yu | 250/208.1 |
| 6,316,786 B1 | * | 11/2001 | Mueller et al. | 257/40 |
| 6,363,096 B1 | * | 3/2002 | Dodabalapur et al. | 372/75 |
| 6,377,597 B1 | * | 4/2002 | Okumura | 372/45 |
| 6,515,314 B1 | * | 2/2003 | Duggal et al. | 257/184 |
| 6,610,455 B1 | * | 8/2003 | Burberry et al. | 430/200 |

OTHER PUBLICATIONS

Adachi, C., et al., "Nearly 100% internal phosphorescence efficiency in an organic light emitting device," *J. of Applied Physics,* 2001, 90(10), 5048–5051.

Baldo, M.A., et al., "High–efficiency fluorescent organic light–emitting devices using a phosphorescent sensitier," *Nature,* 2000, 403, 750–753.

Baldo, M., et al., "Organic vapor phase deposition," *Adv. Mater.,* 1998, 10(18), 1505–1514.

Baldo, M.A., et al., "Excitonic singlet–triplet ratio in a semiconducting organic thin film," *Am. Phys. Soc.,* 1999, 60(20), 14 422–14 428.

(Continued)

Primary Examiner—Minsun Oh Harvey
Assistant Examiner—Delma R. FLores Ruiz
(74) Attorney, Agent, or Firm—Kenyon & Kenyon

(57) ABSTRACT

When the density of excitons in an organic single crystal (including the linear acenes, polyacenes, and thiophenes) approaches the density of molecular sites, an electron-hole plasma may form in the material altering the overall excitonic character of the system. The formation of the electron-hole plasma arises as a result of the screening of Coulomb interactions within individual excitons by injected free carriers. The large exciton densities required to accomplish this screening process can only be realized when excitons collect near dislocations, defects, traps, or are confined in heterostructures. Such confinement and subsequently large exciton densities allows for the observation of physical phenomena not generally accessible in an organic material. Specifically, the formation of an electron-hole plasma in an organic single crystal can allow for the observation of field-effect transistor action and electrically-pumped lasing. Amorphous organic materials and polymeric organic materials can also used to sustain an electron-hole plasma and demonstrate similar phenomena as well.

32 Claims, 19 Drawing Sheets

OTHER PUBLICATIONS

Baldo, M.A., et al., "Transient analysis of organic electrophosphorescence. II. Transient analysis of triplet–triplet–triplet annihilation," *Am. Phys. Soc.*, 2000, 62(16), 10 967–10 977.

Baldo, M.A., et al., "Interface–limited injection in amorphous organic semiconductors," *Am. Phys. Soc.*, 2001, 64, 085201-1–085201-17.

Berggren, M., et al., "Light amplification in organic thin films using cascade energy transfer," *Nature*, 1997, 389, 466–469.

Bjorkholm, J.E., et al., "cw Self–focusing and self–trapping of light in sodium vapor," *Physical Review Letts.*, 1974, 32(4), 129–134.

Brouwer, H.J., et al., "Blue superradiance from neat semiconducting alternating copolymer films," *Adv. Mater.*, 1996, 8(11), 935–937.

Bulović, V., et al., "Weak microcavity effects in organic light–emitting devices," *Am. Phys. Soc.*, 1998, 58(7), 3730–3740.

Burland, D.M., "Cyclotron resonance in a molecular crystal–anthracene," *Phys. Rev. Letts.*, 1974, 33(14), 833–835.

Burland, D.M., et al., "Cyclotron resonance and carrier scattering processes in anthracene crystals," *J. of Chem. Physics*, 1977, 67(1), 319–331.

Burrows, P.E., et al., "Relationship between electroluminescence and current transport in organic heterojution light–emitting devices," *J. Appl. Phys.*, 1996, 79(10), 7991–8006.

Campillo, A.J., et al., "Exciton interactions in crystalline tetracene studies by single picosecond pulse excitation," *Chem. Phys. Letts.*, 1977, 48(3), 495–500.

Chance, R.R., et al., "Molecular fluorescence and energy transfer near interfaces," *Adv. Chem. Phys.*, 1978, 1, 1–65.

Chen, B., et al., "Measurement of electron/hole mobility in organic/polymeric thin films using modified time–of–flight apparatus," *Synthetic Metals*, 1997, 91, 169–171.

D'Andrade, B.W., et al., "High–efficiency yellow double-doped organic light–emitting devices based on phosphor–sensitized fluorescence," *Appl. Phys. Letts.*, 2001, 79(7), 1045–1047.

Forrest, S.R., "Ultrathin organic films grown by organic molecular beam disposition and related techniques," *Chem. Rev.*, 1997, 97, 1793–1896.

Förster, T., "Energy transfer with special reference to biological systems," Discussions of the Faraday Society, *The Faraday Society*, 1959, 27, 1–6.

Frolov, S.V., et al.,"Transiet spectroscopy of tetracene single crystals," *Chem. Phys. Letts.*, 2001, 334, 65–68.

Frolov, S.V., et al., "Mirrorless lasing in conducting polymer poly(2,5–dioctyloxy–p–phenylenevinylene) films," *Jpn. J. Appl. Phys.*, 1996, vol. 35, Part 2, No. 10B, L 1371–L1373.

Hide, F., et al., "Semiconducting polymers: a new class of solid–state laser materials," *Science*, 1996, 273(5283), 1833–1836, http://www.sciencemag.org., 9 pages.

Hill, I.G., et al., "Organic semiconductor heterointerfaces containing bathocuproine," *J. Appl. Phys.*, 1999, 86(8), 4515–4519.

Hill, I.G., et al., "Charge–separation energy in films of II–conjugated organic molecules," *Chem. Phys. Letts.*, 2000, 327, 181–188.

Ishii, H., et al., "Energy level alignment and interfacial electronic structures at organic/metal and organic/organic interfaces," *Adv. Mater.*, 1999, 11(8), 605–625.

Kalinowski, J., et al., "Kinetics of charge carrier recombination in organic light–emitting diodes," *Appl. Phys. Letts.*, 1998, 72(5), 513–515.

Kozlov, V.G., et al., "Study of lasing action based on Förster energy transfer in optically pumped organic semiconductor thin films," *J. of Appl. Phys.*, 1998, 84(8), 4096–4108.

Kozlov, V.G., et al., "Optical properties of molecular organic semiconductor thin films under intense electrical excitation," *Appl. Phys. Letts.*, 1999, 74(8), 1057–1059.

O'Brien, D.F., et al., "Improved energy transfer in electrophosphorescent devices," *Appl. Phys. Letts.*, 1999, 74(3), 442–444.

Pinner, D.J., et al., "Moving the recombination zone in two layer polymer LEDs using high voltage pulses," *Synthetic Metals*, 1999, 1108–1109.

Schön, J.H., et al., "Fractional quantum hall effect in organic molecular semiconductors," *Science*, 2000, 288, 2338–2340.

Schön, J.H., et al., "An organic solid state injection laser," *Science*, 2000, 289, 599–601.

Shtein, M., et al., "Material transport regimes and mechanisms for growth of molecular organic thin films using low–pressure organic vapor phase deposition," *J. of Appl. Sci.*, 2001, 89(2), 1470–1476.

Sokolik, I., et al., "Biomolecular reactions of singlet excitons in tris(8–hydroxyquinoline) aluminum," *Appl. Phys. Lett.*, 1996, 69(27), 4168–4170.

Stampor, W., et al., "Electric field effect on luminescence efficiency in 8–hydroxyquinoline aluminum ($Alq_3$) thin films," *Appl. Phys. Lett.*, 1997, 70(15), 1935–1937.

Tang, C.W., "Organic electroluminescent diodes," *Appl. Phys. Lett.*, 1987, 51(12), 913–915.

Tessler, N., et al., "Properties of light emitting organic materials within the context of future electrically pumped lasers," *Synthetic Metals*, 2000, 115, 57–62.

Tessler, N., et al., "High peak brightness polymer light–emitting diodes," *Adv. Mater.*, 1998, 10(1), 64–68.

Tessler, N., et al., "Lasting from conjugated–polymer microcavities," *Nature*, 1996, 382, 695–697.

Tokito, S., et al., "High–temperature operation of an electroluminescent device fabricated using a novel triphenylamine derivative," *Appl. Phys. Lett.*, 1996, 69(7), 878–915.

Tokito, S., et al., "Temperature dependences of electroluminescent characteristics in the devices fabricated with novel triphenylamine derivatives," *IEEE Trans. On Electron Devices*, 1997, 44(8), 1239–1244.

Tsutsui, T., et al., "High quantum efficiency in organic light–emitting devices with iridium–complex as a triple emissive center," *Jpn. J. Appl. Phys.*, 1999, 38, L1502–L1504.

\* cited by examiner

ORGANIC LIGHT EMITTING DEVICES BASED ON THE FORMATION OF AN ELECTRON-HOLE PLASMA

GOVERNMENT RIGHTS

This invention was made with Government support under one or more contracts. The government may have rights in this invention.

RESEARCH AGREEMENTS

The claimed invention was made by, on behalf of, and/or in connection with one or more of the following parties to a joint university-corporation research agreement: Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

This invention relates to organic light emitting devices. More particularly, the invention relates to organic light emitting devices having compositions and geometries that are suitable to provide lasing based on the formation of an electron hole plasma within the device.

BACKGROUND OF THE INVENTION

Recent reports of electrically-pumped lasing and optical gain in organic semiconductor crystals and optically pumped lasing in amorphous semiconducting thin films have encouraged the pursuit of practical organic semiconductor lasers. Organic thin-films accommodate low-cost fabrication, and can exploit the wide variety of dye molecules in inexpensive organic lasers that are tunable across the visible spectrum. These properties may ultimately enable organic materials to find practical application in electrically-pumped lasers.

Conventional semiconductor lasers use covalently-bonded crystalline materials. One reason for the success of these devices is that the photoluminescence efficiency of a direct-energy-gap crystalline semiconductor such as GaAs is approximately 100%, independent of excitation strength. Organic light emitting devices (OLEDs) have also demonstrated a maximum internal efficiency approaching 100%. However, the highest efficiency organic electroluminescence is typically realized at low current densities because non-radiative losses increase under high injection. At the excitation densities required for electrically-pumped lasing, such losses might render organic lasers impractical.

Previously, the inability to realize electrically-pumped lasers using amorphous organic films was attributed to the optical absorption of injected charge, or 'polaron absorption.' In the following description, singlet-singlet, singlet-polaron, and singlet-triplet quenching, and electric field-induced exciton dissociation, are examined. Singlet-singlet annihilation may prevent the achievement of lasing in crystalline materials, unless it can be overcome. In amorphous films, triplets induce losses that can be minimized by high rates of triplet-triplet and triplet-polaron annihilation, and in films that employ Förster energy transfer between host and guest molecules, singlet-polaron quenching limits the quantum efficiency.

The effect of all non-radiative processes is quantified by the external quantum efficiency-current density product, $\eta_{EXT}J$. Since singlet-polaron quenching is the non-radiative analog of polaron absorption, an intensity independent quantum efficiency is associated with low polaron absorption. Bimolecular non-radiative losses such as singlet-polaron annihilation increase with excitation strength, thus amorphous thin film laser structures must be designed to operate at threshold current densities $J_{TH} < 1000$ A/cm$^2$.

As a prototype crystalline laser, the tetracene device of Schön et al. is discussed in detail herein. Although electrically-pumped lasing has not been convincingly demonstrated, significant spectral narrowing suggests that lasing may be achievable with an improved device structure. The bulk tetracene crystals used in this device possess low optical confinement making it difficult to account for the observation of spectral narrowing at the reported threshold current density. Consequently, the inventors examined the possible effects of electron hole plasmas (EHPs) and defect or interface initiated self-focusing, and found that the formation of an EHP replaces the dominance of excitonic effects in the optical properties of organic semiconductors with more band-like characteristics. This, in turn, reduces or even eliminates multi-exciton annihilation that presents a significant barrier to gain at lower excitation densities.

The observation of electron-hole plasmas (EHPs) is a common occurrence in both direct and indirect inorganic semiconductor materials. In fact, in III-V semiconductor lasers, light emission can be a direct result of the presence of an EHP that is formed within the device. EHPs can result from extremely high densities of charges and excitons present near an interface, or confined in a heterostructure. An EHP can be formed when the density of electron-hole pairs, $n^c_p$, is greater than approximately $1/a_B^3$, where $a_B$ is the Bohr radius of the excitons. Accordingly, $1/a_B^3$ can be referred to as the "critical density" for the formation of an EHP. For organic materials, an exciton is often no larger than a molecular diameter (i.e., on the order of 10 Å), implying critical densities on the order of the molecular density.

In crystalline devices, the interfacial charge density in the exciton formation zone can reach $10^{13}$ cm$^{-2}$. That is, the density of charges may approach the density of molecular sites. Under such conditions, free carriers screen Coulomb interactions within the excitons themselves. In addition, phase space filling of the bands at the interface excludes some electronic states required to complete excitonic wave-functions. Both screening by free carriers and phase space filling prevent exciton formation, and lead to the creation of an EHP. For an organic molecular crystal with localized excitons, the exciton density required for the formation of an EHP (which, as described above, is related to the size of the excitons) is expected to approach the density of molecular sites.

One consequence of the formation of an EHP is the disappearance of the quasi-particle nature of discrete excitons. This in turn eliminates many excitonic processes such as multi-exciton annihilation and spin-selective radiative recombination in favor of direct band-to-band recombination at an interface or other region where excitons and carriers could localize at high densities, such as, for example, a region surrounding a defect or inside a heterostructure.

The prior art has suggested a light-emitting field effect transistor in which excitons are generated, leading to radiative recombination (see Schön, et al, A Light-Emitting Field Effect Transistor). Above a certain threshold, Schön teaches, coherent light is emitted through amplified spontaneous emission.

FIG. 1 is a schematic picture of an ambipolar FET 100 according to Schön under balanced electron and hole injection (i.e., $V_g \approx \frac{1}{2} V_d$). Whereas electrons are accumulated near the source electrode 112, the negative bias of the gate 120 with respect to the drain 114 results in the accumulation of positive charge carriers close to the drain region. Assuming similar mobilities for both types of charge carriers in the organic layer 116, as in the case of α-6T, more or less balanced electron and hole injection is found at a gate bias of $V_g \approx \frac{1}{2} V_d$, which is high compared to the threshold voltages for n- or p-channel activity. In the case of a positive gate bias, electrons are accumulated near the source electrode 112. However, close to the drain region, the gate bias with respect to the drain 114 is negative, resulting in the accumulation of positive charge carriers. Consequently, a pn-junction is formed in the channel region 118 of the transistor 100. The two carrier types flow toward each other, excitons are generated, and radiative emission from the transistor 100 is observed. Hence, according to Schön, the FET 100 works as an LET.

The device of Schön, however, does not teach or suggest the formation of an EHP within the device. It would be advantageous, therefore, if there were available organic light emitting devices having compositions and geometries that are suitable to provide lasing based on the formation of an electron hole plasma within the device.

SUMMARY OF THE INVENTION

These needs in the art are satisfied by light emitting devices according to the invention having compositions and geometries that cause the formation of an electron hole plasma (EHP) within the device. A light emitting device according to the invention can includes an organic layer, a first electrical contact that is adapted to inject electrons into the organic layer, and a second electrical contact that is adapted to inject holes into the organic layer, such that an EHP is formed within the organic layer. The EHP can be formed when the density of electron-hole pairs within the organic layer is greater than approximately $1/a_B^3$, where $a_B$ is the Bohr radius of the electron-hole pairs.

Devices according to the invention can be configured to emit laser light when the EHP is formed. Such devices can include means for optically confining an optical mode of light, means for electrically confining charge carriers, and/or means for resonating light, within a lasing region of the device, such that the organic layer emits laser light when the EHP is formed.

The contacts can be disposed on the organic layer such that a portion of the organic layer between the contacts has an effective index of refraction that is greater than the effective index of refraction of the portions on which the contacts are disposed. Thus, an optical mode of the laser light can be generally confined in the portion of the organic layer between the contacts.

In some preferred embodiments of the invention, the organic layer can be disposed on a substrate that has a nominal index of refraction that is less than the nominal index of refraction of the organic layer. A first, relatively thin, insulating layer, having a nominal index of refraction that is greater than the nominal index of refraction of the organic layer, can be disposed on the organic layer. A second, relatively thick, insulating layer, having a nominal index of refraction that is less than the nominal index of refraction of the first insulating layer, can be disposed on the first insulating layer. A gate contact can be disposed on the second insulating layer.

The device can include an optical resonator that confines an optical mode of the light within the organic layer. For example, the organic layer can be disposed between a pair of gratings on the substrate. Alternatively, the insulating layer disposed on the organic layer can include a grating.

In a gateless embodiment, the organic layer can be disposed on a layer of high band-gap material that has a band-gap that is higher than the band gap of the organic layer and a nominal index of refraction that is less than the nominal index of refraction of the organic layer. In such an embodiment, the HOMO of the high band gap layer can be higher than the HOMO of the organic layer, and the LUMO of the high band gap layer lower than the LUMO of the organic layer.

BRIEF DESCRIPTION OF THE SEVERAL VIEWS OF THE DRAWING

Other features of the invention are further apparent from the following detailed description of the embodiments of the present invention taken in conjunction with the accompanying drawing.

DETAILED DESCRIPTION OF THE INVENTION

Generally, devices according to the invention exploit the formation of an electron-hole plasma (EHP) within an organic layer of the device. The embodiments disclosed herein provide technologically applicable structures based preferably on crystalline or amorphous organic thin films or polymers that maximize electrical (i.e., carrier) confinement, optical (i.e., modal) confinement, and photon confinement (i.e., feedback) in the device.

Figure 1:
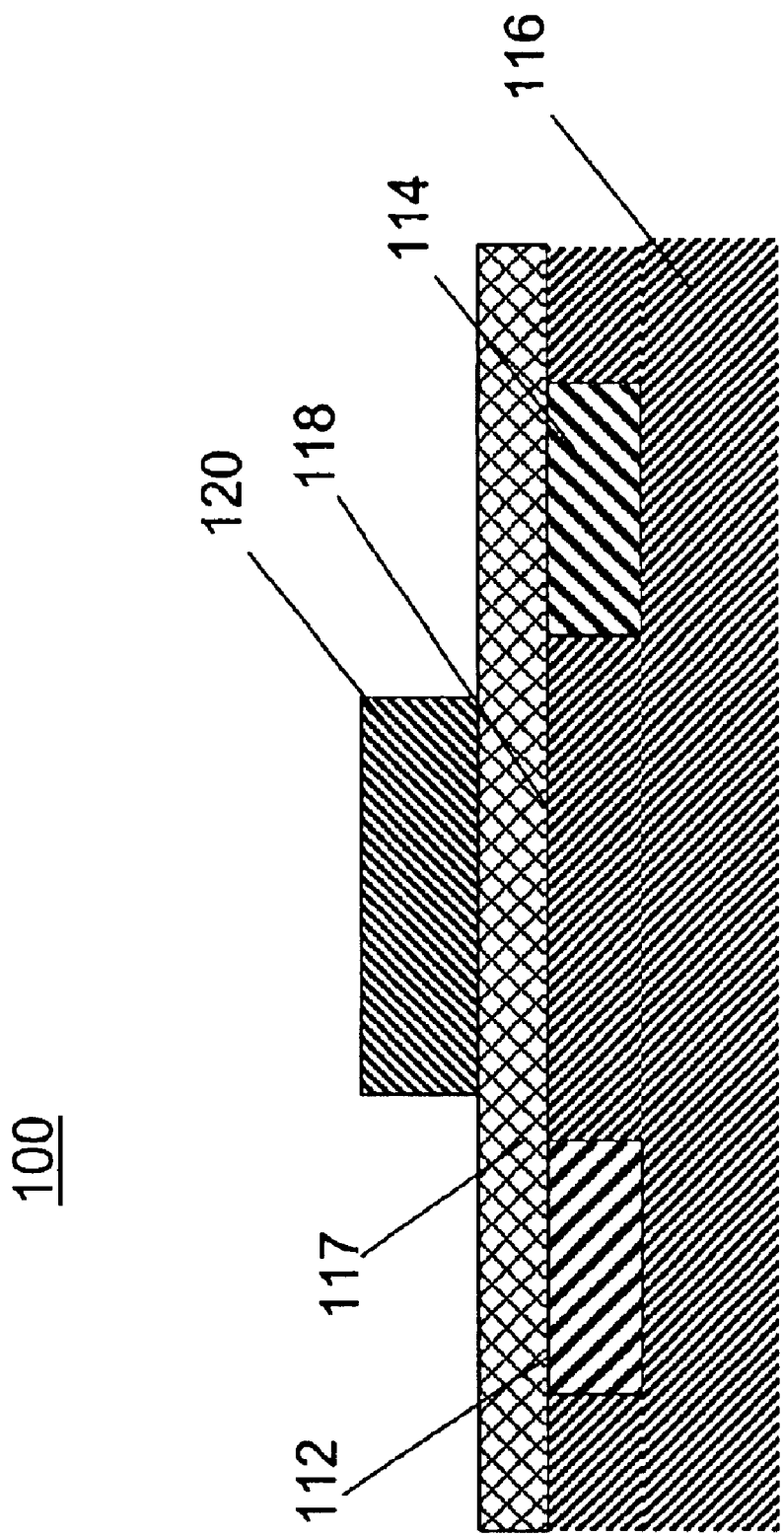
FIG. 1 depicts a device suggested in the prior art for laser action in organic semiconductors.
Figure 2:
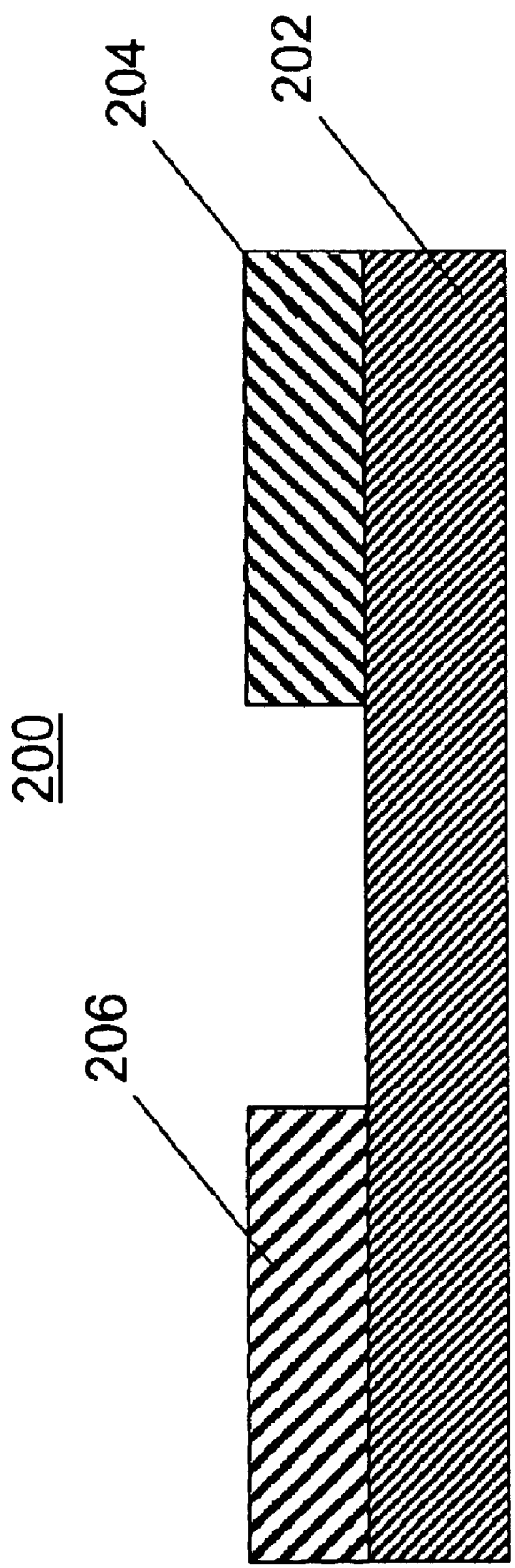
FIG. 2 depicts a preferred embodiment of a light emitting device according to the invention.

FIG. 2 depicts a light emitting device 200 according to the invention. As shown, the device 200 includes an organic thin film layer 202, having a preferred thickness on the order of about 50 nm. Typical dimensions for a device according to the invention are 5 mm×5 mm, although smaller devices, such as 0.5 mm×0.5 mm, are possible. The device also includes a first electrical contact 204 that is adapted to inject electrons into the organic layer 202, and a second electrical contact 206 that is adapted to inject holes into the organic layer 202. According to the invention, the first and second electrical contacts 204, 206 inject electrons and holes, respectively, such that an EHP is formed within the organic layer 202. Based on the formation of the EHP, light is emitted from the organic layer 202.

In a preferred embodiment, each of the first contact 204 and the second contact 206 can be made of a thin film of a transparent conducting oxide, such as indium-tin oxide (ITO), for example. It is preferred that the contacts 204, 206 be as transparent as possible to the emission wavelength of the organic 202 to minimize absorption losses. Preferably, the first contact 204 has a thin (e.g., ~1 nm) interfacial layer of appropriate material to inject holes into the organic layer 202, and the second contact has a thin interfacial layer of appropriate material to inject electrons into the organic layer 202.

Examples of materials from which the interfacial layer of the electron injecting contact can be made include, without limitation, low work function metals such as aluminum (Al) or silver (Ag), or widely used organic light emitting device contact materials such as lithium fluoride/aluminum (LiF/Al) or magnesium/silver (Mg/Ag). Examples of materials from which the interfacial layer of the hole injecting contact can be made include, without limitation, high work function metals such as platinum (Pt) or gold (Au), or conducting oxides such as indium-tin oxide (ITO).

Thus, an EHP can be formed within the organic layer as a result of pumping a sufficient current density or quantity of charge carriers or excitons into the organic layer. It should be understood that a device, such as described above in connection with FIG. 2, that emits light based on the formation of an EUP within the organic layer can be a superluminescent device. Such a device can also be suitable for lasing. It should be understood that, with in the context of this specification, lasing devices should be considered superluminescent devices, and that not all superluminescent devices are lasing devices.

Figure 3A:
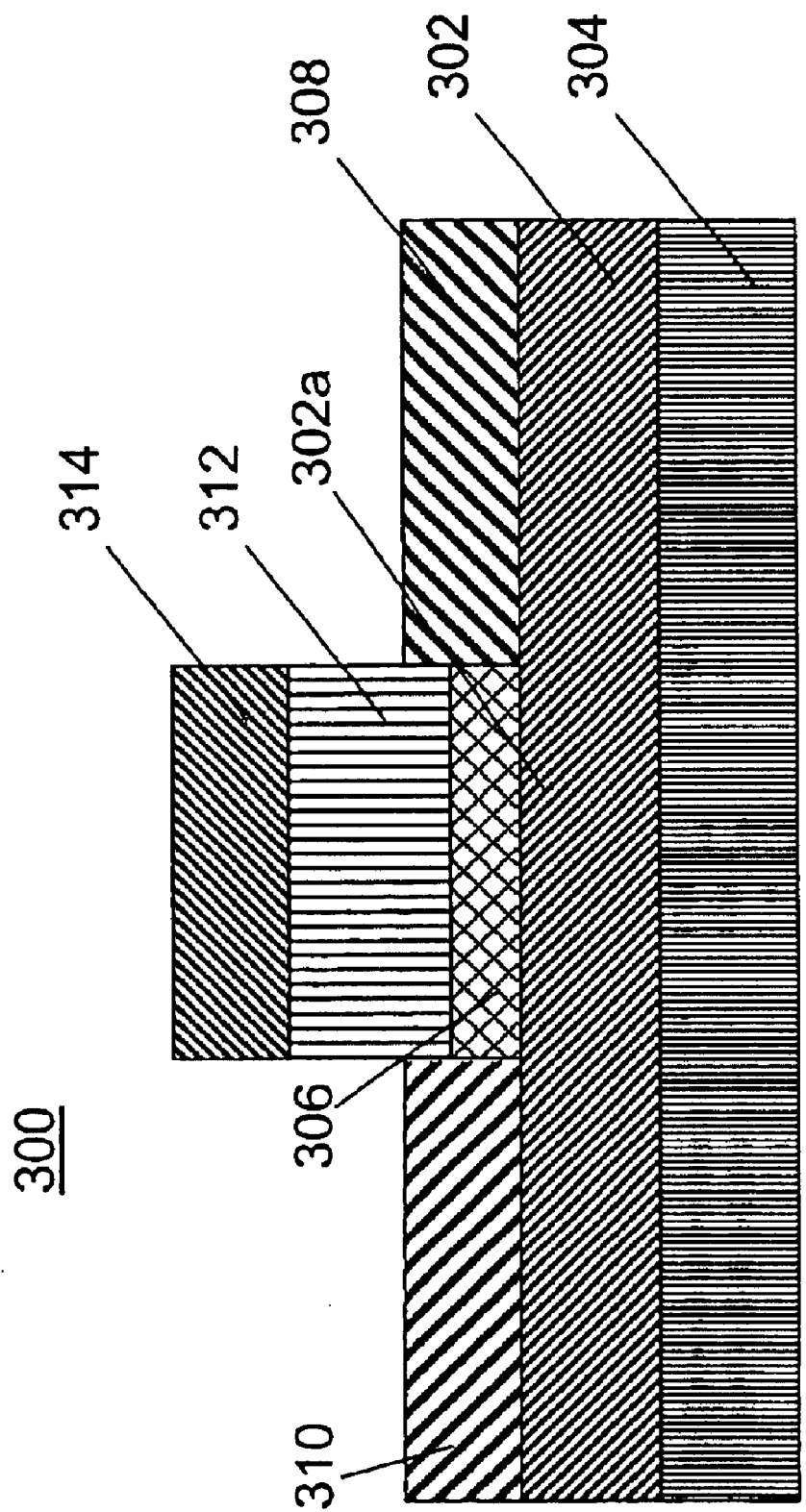
FIGS. 3A and 3B depict a preferred embodiment of a light emitting device according to the invention with DBR feedback.

An example of a light emitting device that can be constructed in accordance with the principles of the invention is a field effect transistor (FET) that is suitable for lasing. FIG. 3A depicts a light emitting FET 300 according to the invention with optical confinement and feedback that make it suitable for lasing. In this structure, an organic thin film layer 302, having a preferred thickness on the order of about 50 nm, is deposited onto a substrate 304. Suitable lasing materials from which the organic layer 302 can be made may be recognized by a quantum efficiency that is relatively independent of current density and electric field. For reasons that will be discussed in greater detail below, the organic layer 302 is preferably made of an organic material having an external quantum efficiency-current density product, $\eta_{EXT}J$, of at least about 5 A/cm². Preferably, the substrate 304 is transparent to the wavelength of light emitted by the organic thin film 302. Preferably, the substrate 304 comprises at least one of plastic, glass, and silicon coated with a thick layer of $SiO_2$.

A relatively thin, high index, insulating layer 306 is then deposited onto a portion of the organic thin film layer 302. Preferably, the high index insulating layer 306 has a thickness of between about 5 nm and about 500 nm; more preferably, of about 50 nm. Optimally, the thickness of the high index insulating layer 306 can be chosen such that it supports propagation of one or only a few optical modes of the light emitted. A first electrical contact 308 and a second electrical contact 310 are also deposited onto the organic layer 302. Contacts 308 and 310 make up the source and drain, respectively, of the FET 300. A relatively thick, low index layer 312 is deposited onto the high index insulator 306. The low index layer is capped by a thin gate contact 314.

It is preferred that the substrate 304 be transparent to the emission wavelength of the organic thin film 302 to minimize absorption losses. Also, to minimize losses due to propagation into the substrate 304 of the optical mode of the light emitted from the organic 302, it is preferred that the substrate 304 have a nominal index of refraction, $n_S$, that is less than the nominal index of refraction, $n_A$, of the organic layer 302.

In a preferred embodiment, each of the first contact 308 and the second contact 310 can be made of a thin film of a transparent conducting oxide, such as indium-tin oxide (ITO), for example. It is preferred that the contacts 308, 310 be as transparent as possible to the emission wavelength of the organic 302 to minimize absorption losses. Preferably, one of the contacts has a thin (e.g., ~1 nm) interfacial layer of appropriate material to inject holes into the organic layer 302, and the opposing contact has a thin interfacial layer of appropriate material to inject electrons into the organic layer 302.

Preferably, the thin insulating layer 306 has a nominal index of refraction, $n_H$, that is larger than the nominal index of refraction, $n_{sc}$ of the source contact 308 (i.e., $n_i > n_{sc}$), and also larger than the index of refraction, $n_{dc}$, of the drain contact 310 (i.e., $n_i > n_{dc}$). This relationship between $n_H$, $n_{sc}$, and $n_{dc}$ serves to laterally confine the optical mode in a portion, or "lasing region," 302a of the organic layer 302 that is generally between the contacts 308, 310. That is, the difference in index between the insulating layer 306 and the contacts 308, 310 provides lateral confinement of the optical mode within the device 300 (i.e., confinement of the optical mode between the source contact 308 and the drain contact 310). Also, because the contacts 308, 310 are exposed to air, the effective index in the portion of the organic layer 302 onto which the insulator 306 is disposed is less than the effective index in the portions of the organic layer 302 onto which the contacts 308, 310 are disposed. This lateral confinement of the optical mode serves to confine excitation in the organic 302 between the contacts 308, 310, which aids in the achievement of a concentration of the optical field near the high charge density region necessary to provide a low threshold current density for lasing.

Similarly, the difference in index between the insulating layer 306 and the organic layer 302 provides vertical confinement of the optical mode within the device 300 (i.e., confinement of the optical mode transverse to the plane of the organic layer 302). For example, if the contacts 308, 310 are made of ITO, which has an index of refraction of 2.0, then the thin insulating layer 306 could be made of titanium oxide $TiO_2$, for example, which can have an index ranging from 2.2 to 2.4. The presence of this thin, high index, insulating layer 306 causes the optical mode to be confined between the thin insulating layer 306 and the organic layer 302. This transverse confinement of the optical mode serves to confine the excitation in the organic 302, which further aids in the achievement of a concentration of the optical field near the high charge density region necessary to provide a low threshold current density for lasing.

To further confine the optical mode between the thick insulating layer 312 and the organic layer 302, it is preferred that the thick insulating layer 312 have a nominal index of refraction, $n_L$, that is less than the nominal index of refraction, $n_H$, of the thin insulating layer 306. For example, if the thin insulating layer 306 is made of $TiO_2$, then the thick insulating layer can be made of silicon oxide $SiO_2$, for example, which has an index of 1.46, or a low index silicon nitride $SiN_x$.

Preferably, to minimize absorption, the material from which the gate contact 314 is made is transparent to the emission wavelength of the organic 302. The thick insulating layer 314, however, can be made sufficiently thick such that the optical mode has a negligible amplitude once it reaches the gate 314. Consequently, the gate contact 314 can be made of non-transparent metals, such as gold, for example. The gate 314 serves to provide electrical confinement in the lasing region 302a by confining carriers injected into the device 300 to the organic layer 302. This electrical confinement also adds to the exciton density in the lasing region 302a, and helps to enable the device 100 to achieve the large exciton densities necessary to reach the threshold current density for lasing.

Figure 3B:
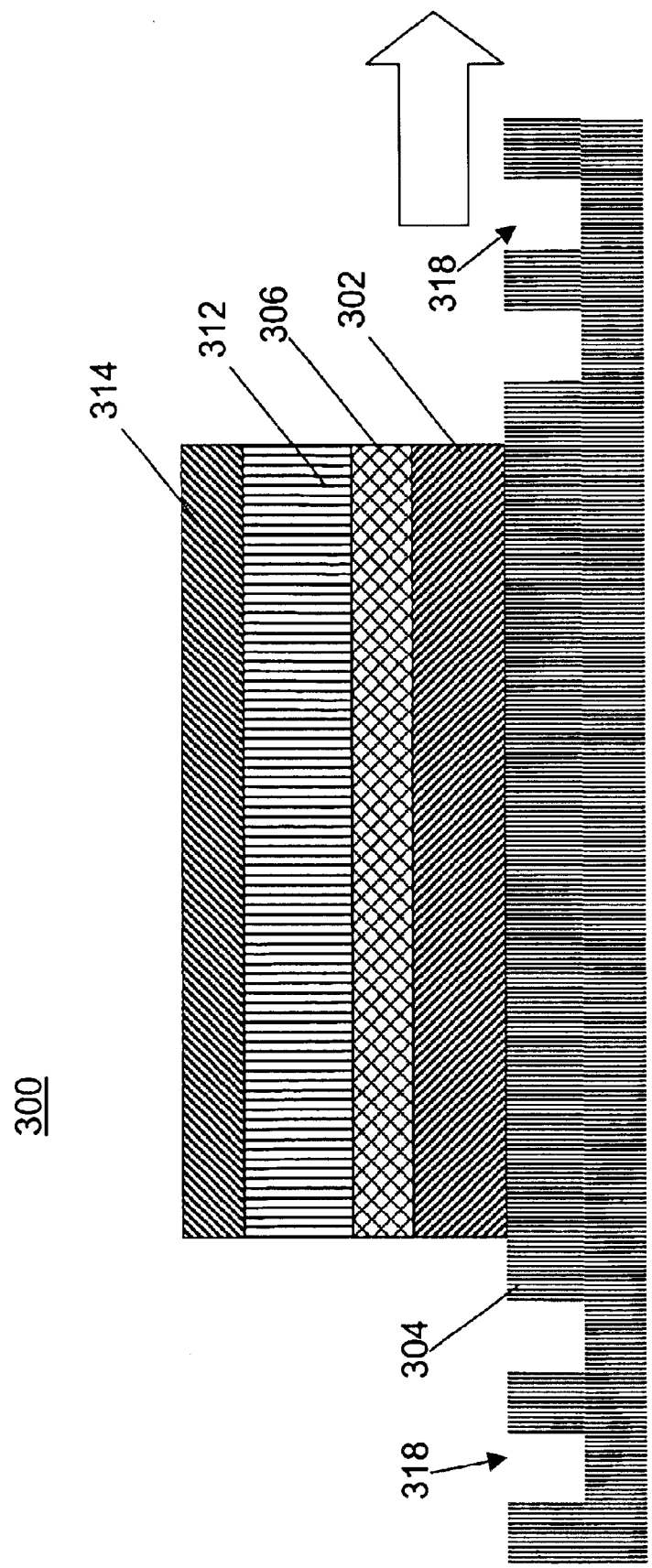

In the device 300 depicted in FIG. 3A, light emission occurs preferentially in the direction perpendicular to the page. In this direction, efficient feedback is present to form a laser cavity in the lasing region 302a. Feedback can be provided by any of a number of different mechanisms. As shown in FIG. 3B, the device 300 can include a distributed Bragg reflector (DBR) feedback mechanism. In a DBR configuration, one or more gratings 318 can be etched into the substrate 304 (as shown in FIG. 3B) or into the thin insulating layer 306 (not shown). It should be understood that, in this case, the feedback structure (e.g., the gratings) is separated from the gain region of the device (which is in the organic layer 302).

It should be understood that, when light is incident on a dielectric interface, such as the boundary between two regions having different refractive indexes, a certain percentage of that light is reflected based on the difference in index between the two materials. Similarly, a grating such as described above creates a periodic variation in the index of refraction so that as the light passes near or through the grating, it "senses" the changing index of refraction, just as if the light were striking a dielectric interface. Each time the index of refraction changes, a fraction of the beam is reflected back towards the lasing medium, which can be viewed as a large number of dielectric interfaces. This process continues over and over again, with the reflections back through the lasing medium combining to give rise to a very intense and coherent beam of light (i.e., a laser beam).

Figure 4:
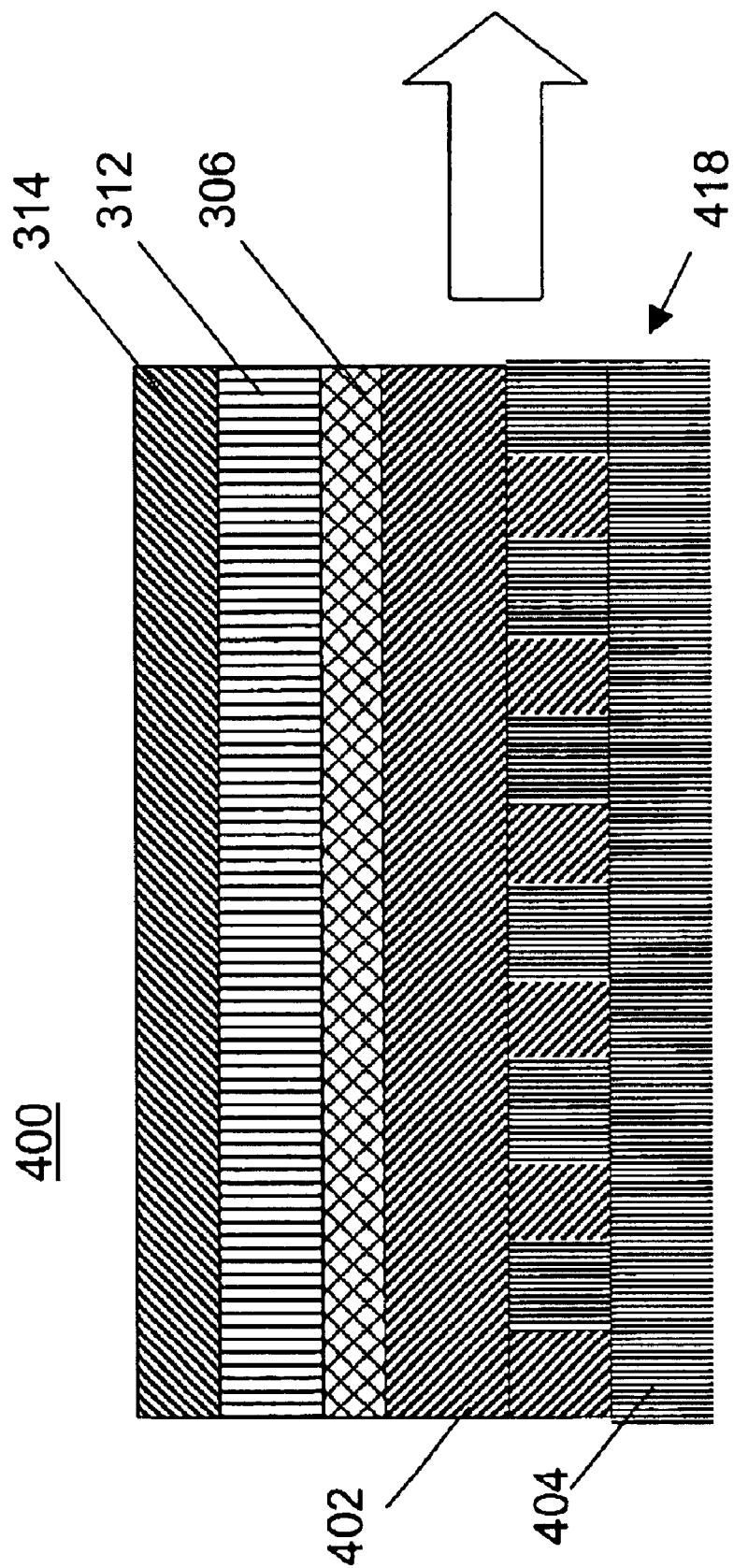
FIG. 4 depicts a preferred embodiment of a light emitting device according to the invention with DFB feedback.

In a distributed feedback (DFB) configuration, a preferred embodiment of which is depicted in FIG. 4, a grating 418 can be etched into the substrate 404 (as shown in FIG. 4), or into the thin insulating layer 406 (not shown). Preferably, such a grating can be tuned to the peak emission wavelength of the organic layer 402, and extend along the width of the organic layer 402. Thus, it should be understood that, in a DFB configuration, the gain and feedback take place simultaneously in the same region of the device 400.

Figure 5A:
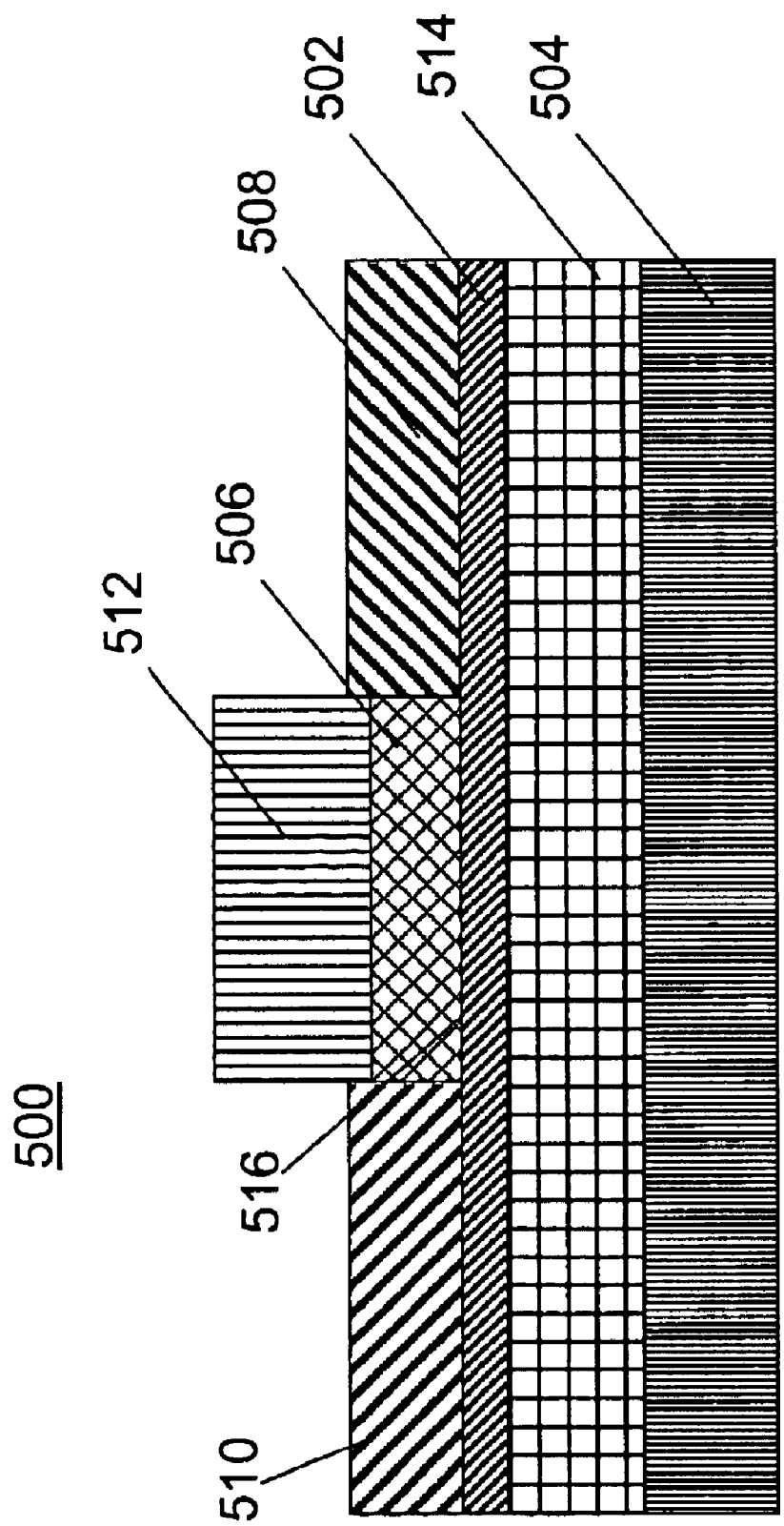
FIGS. 5A and 5B depict another preferred embodiment of a light emitting device according to the invention.
Figure 5B:
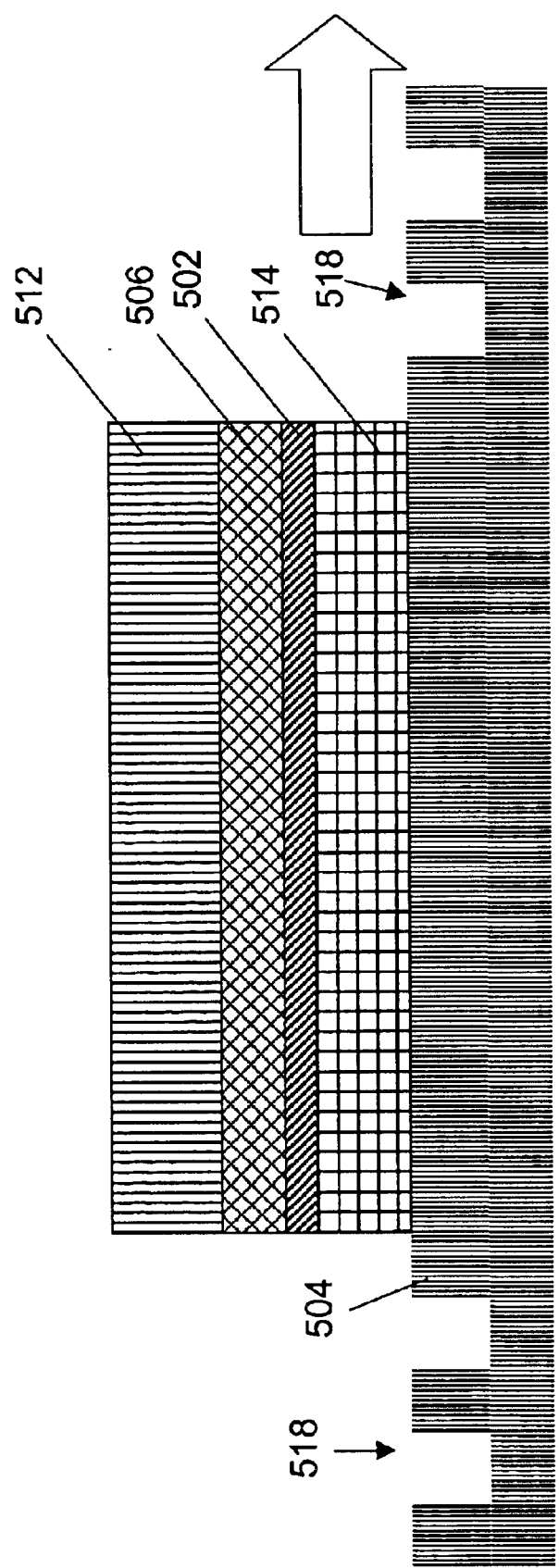

FIGS. 5A and 5B depict another preferred embodiment of the invention in which a different approach is taken to achieve the confinement necessary for the formation of an EHP within the device 500. As shown in FIGS. 5A and 5B, instead of using a gate to confine charge at the interface 516 between the insulator 506 and the organic layer 502, a heterostructure is employed. A high band-gap layer 514 is disposed between the organic layer 502 and the substrate 504. Preferably, the high band-gap layer 514 can be made of a material such as polytetrafluoroethylene ("ptfe"), for example. It should be understood, however, that the high band gap layer 514 can be made of any material that has a band-gap that is significantly larger, and an index of refraction that is significantly smaller, than those of the light emitting organic layer 502. A relatively thick, low index layer 512 is deposited onto the high index insulator 506. Preferably, the energy level of the highest occupied molecular orbitals (HOMO) of the high band gap layer is higher than the HOMO of the organic layer, and the energy level of the lowest unoccupied molecular orbitals (LUMO) of the high band gap layer is lower than the LUMO of the organic layer.

Additionally, the emissive organic layer 502 can be made relatively thin compared to the organic layer of a device having a gate. Preferably, the organic layer 502 has a thickness on the order of 20 Å. Hence, charge carriers can be confined in a 20 Å thick well between the high band-gap layer 514 and insulating layer 506 (which can be made of titanium oxide, for example).

It is preferred that the contacts 508, 510 are made of different materials so as to ensure injection of both electrons and holes into the FET channel. Examples of materials from which an electron injecting contact can be made include, without limitation, low work function metals such as aluminum (Al) or silver (Ag), or widely used organic light emitting device contacts such as lithium fluoride/aluminum (LiF/Al) or magnesium/silver (Mg/Ag). Examples of materials from which a hole injecting contact can be made include, without limitation, high work function metals such as platinum (Pt) or gold (Au), or conducting oxides such as indium-tin oxide (ITO).

As shown in FIG. 5B, the device 500 can have a DBR feedback mechanism in the form of gratings 518 etched into the substrate 504. It should be understood, however, that the gateless design depicted in FIGS. 5A and 5B also allows additional design freedom in that a DFB grating structure can be placed on the surface of the insulating layer.

Figure 6:
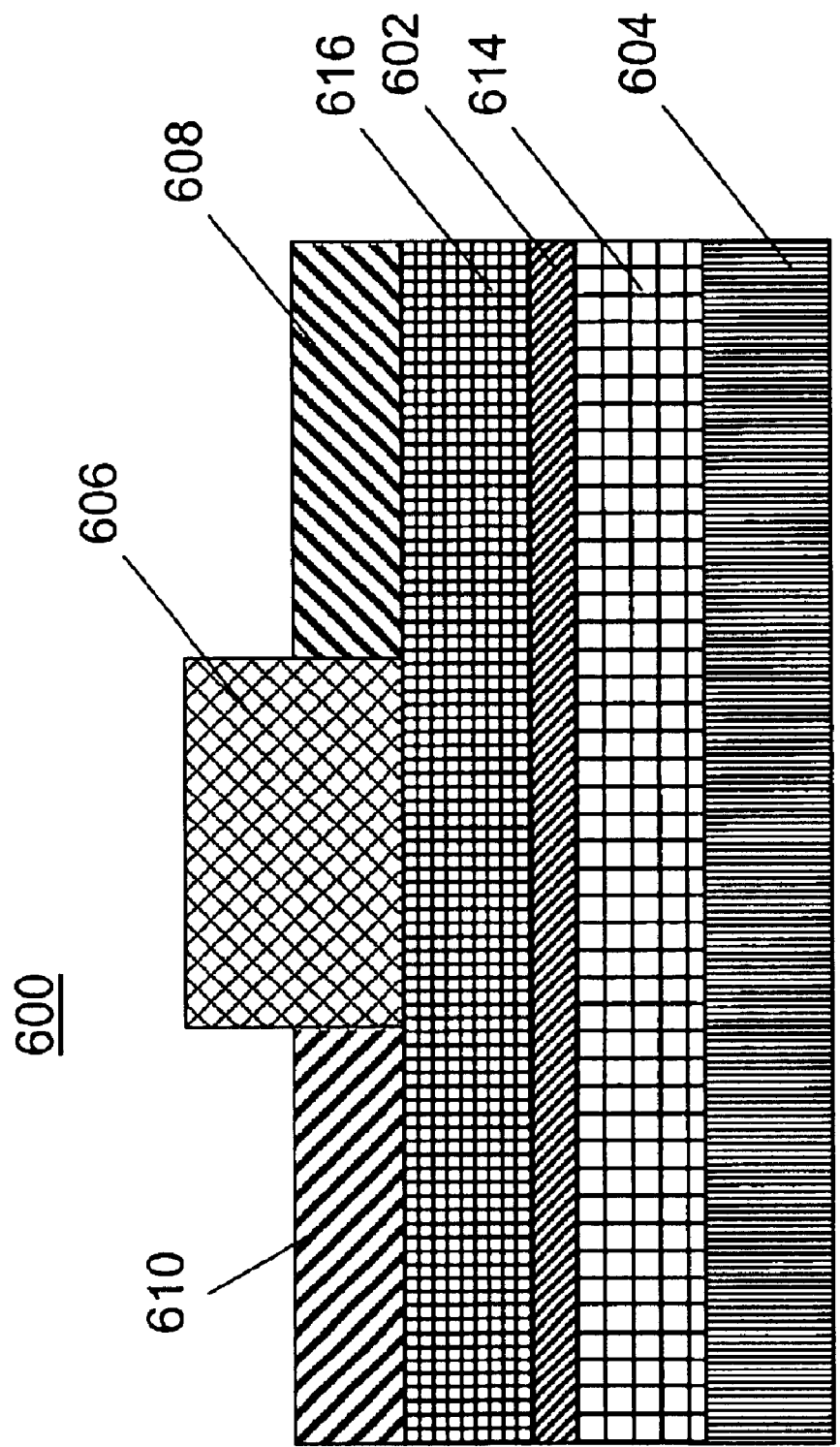
FIG. 6 depicts another preferred embodiment of a light emitting device according to the invention.

FIG. 6 depicts another gateless embodiment of the invention. As shown in FIG. 6, the device 600 includes an organic layer 602 that is disposed between two high band gap layers 614, 616. The high band gap layer 614 is deposited on a substrate 604. Preferably, each of the high band-gap layers 614, 616 has a band gap that is larger, and a nominal index of refraction that is significantly smaller, than that of the light emitting organic layer 602. A relatively thick, high index insulator 606 is deposited on the high band-gap layer 616. Preferably, the HOMO energy levels of the each of the high band gap layers 614, 616 is higher than the HOMO level of the organic layer, and the LUMO levels of the high band gap layers 614, 616 is lower than the LUMO level of the organic layer 602. Thus, a double heterostructure can be formed between the high bad gap layers 614 and 616.

As with the embodiment depicted in FIGS. 5A and 5B, it is preferred that the contacts 608, 610 are made of different materials so as to ensure injection of both electrons and holes into the FET channel. Again, the emissive organic layer 602 can be made relatively thin, having a thickness on the order of 20 Å. Hence, charge carriers can be confined in a 20 Å thick well between the high band-gap layers 614 and 616.

Preferably, layer 616 is thin enough so that charge can be injected into the organic layer 602 and so that the mode confined to the interface between layer 606 and layer 616 stretches significantly into the emissive layer 602. Preferably, the high band gap layer 616 has a nominal index of refraction that is greater than the nominal index of refraction of the organic layer 602, and the nominal index of refraction of the organic layer 602 is greater than the nominal index of refraction of the high band gap layer 614.

In the following discussion, the effects of non-radiative losses on lasing in crystalline and amorphous organic thin films are examined. In crystalline films, the dominant loss mechanism is singlet-singlet annihilation, and this must be avoided if lasing is to be achieved at practical current densities. The electrically-pumped crystalline tetracene laser structure of Schön, et al. "An Organic Solid State Injection Laser," (Science 289, 599 Jul. 28, 2000) is studied in detail. Optical and electrical confinement in the bulk structure appears unable to explain the spectral narrowing observed. Consequently, electron hole plasmas, and self-focusing at interfaces and crystal defects, are considered as possible sources of the observed phenomena. In amorphous films, lasers are likely to have to operate at current densities $J<1000$ A/cm$^2$ due to a combination of non-radiative losses.

The performance of potential lasing materials is quantified by the external quantum efficiency-current density product, $\eta_{EXT}J$. Electrically pumped lasers require $\eta_{EXT}J \sim 5$ A/cm². The best amorphous devices, however, currently possess $\eta EXT_J \sim 0.3$ A/cm². The inventors have demonstrated, however, that electrically-pumped lasing in amorphous materials should be possible using indirect pumping techniques.

Energy transfer to singlet excitons, triplet excitons, and polarons is a ubiquitous source of loss in organic materials. For losses to occur, it is necessary for the absorption spectrum of the quenching species to overlap with the fluorescence spectrum of the radiative singlet exciton. The energy of the singlet exciton may then be transferred to the quenching species, either by long range Förster transfer or by a direct collision-mediated exchange. It is possible, for example, that singlet fluorescence in an organic molecule will overlap with the polaron absorption spectrum. Owing to the increased electrical polarization of a charged molecule and its neighbors, the optical transitions of the ionized species are typically red-shifted with respect to those of the neutral molecule. Therefore, in systems where Förster energy transfer from host to guest molecules is prevalent, guest polarons are likely to cause quenching of host singlets. Similarly, the transition between the first and second triplet excited states is typically less than the energy of the first singlet excited state. Thus, exchange energy interactions ensure that singlet fluorescence in an organic molecule will overlap with its triplet absorption.

As current density increases, these losses also increase and are consequently expected to be significant in electrically-pumped lasers. The rate of energy transfer-mediated singlet exciton quenching is:

$$\kappa = 4\pi DR, \tag{1}$$

where D is the diffusion constant of singlet excitons and R is the energy transfer radius, dependent on the overlap of the singlet emission spectrum with the absorption spectrum of the quenching species. Here, $\kappa$ represents non-radiative rates that depend on the concentration of the quenching species. For non-radiative rates that are not empirically determined, an energy transfer radius of $R \sim 10$ Å is often assumed.

Equation (1) suggests that non-radiative losses are especially severe in crystalline materials, because the diffusion constant of singlet excitons, D, increases with molecular order. Indeed, energy transfer between singlet excitons is a significant loss mechanism in crystalline materials such as tetracene, where the singlet diffusion constant is estimated to be $D \sim 4 \times 10^{-2}$ cm²/s, as compared to $D \sim 1 \times 10^{-5}$ cm²/s in an amorphous material such as tris(8-hydroxyquinoline) aluminum (Alq$_3$). This process, known as singlet-singlet annihilation, follows:

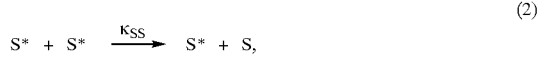

(2)

where the rate is $\kappa_{SS}$, and S* and S are the excited and ground molecular singlet states, respectively.

Although singlet-singlet annihilation is much stronger in crystalline than in amorphous materials, singlet-triplet and singlet-polaron losses are typically weaker. Consequently, in crystalline laser structures, such as that of Schön, et al. shown in FIG. 7A, the focus of the analysis is on singlet-singlet annihilation.

Figure 7A:
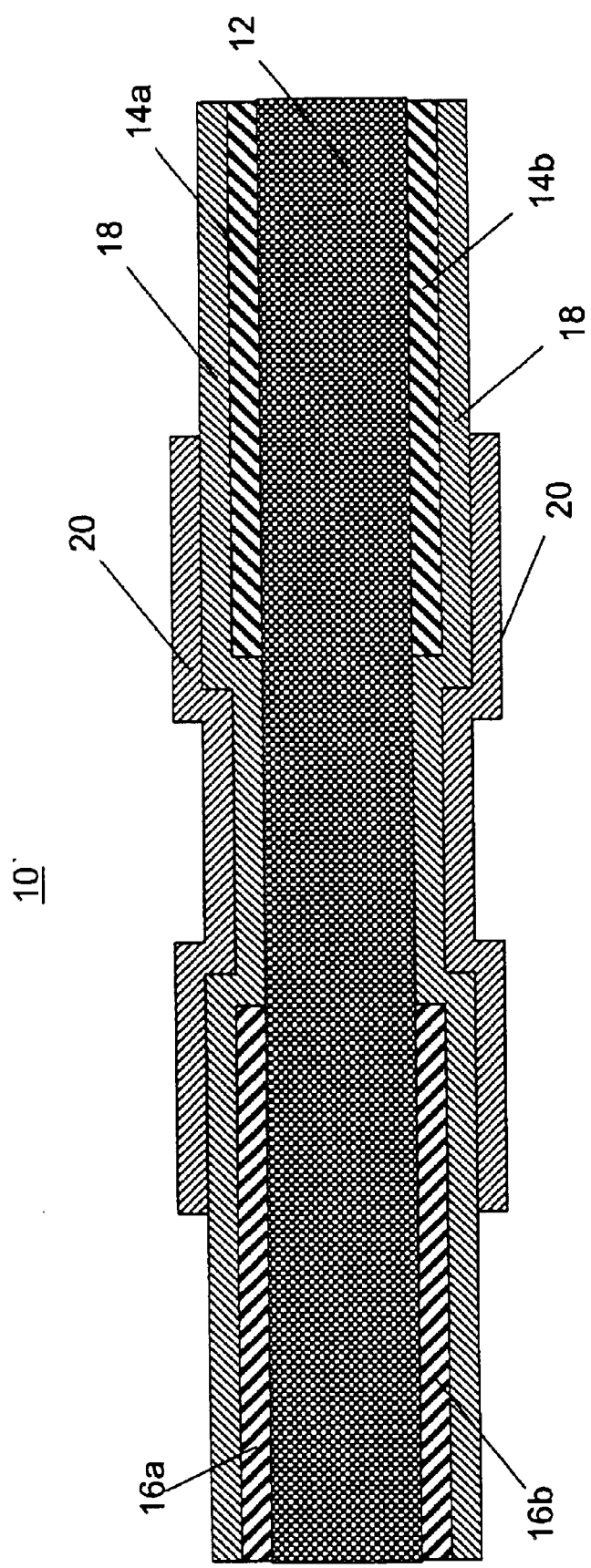
FIG. 7A depicts a known electrically-pumped crystalline tetracene laser structure.

FIG. 7A depicts a known electrically-pumped crystalline tetracene laser structure disclosed by Schön, et al. As shown in FIG. 7A, the structure 10 includes a tetracene lasing medium 12, a pair of metal source electrodes 14a, 14b, a pair of metal drain electrodes 16a, 16b, an Al$_2$O$_3$ gate insulator 18, and a transparent gate 20 made of Al doped with ZnO.

Molecular order in crystals increases the charge transport mobility, which lowers the density of polarons at a given current density, and increases the rate of triplet losses, decreasing singlet-triplet annihilation. Tetracene has rates of triplet-triplet and triplet-polaron annihilation that are at least two orders of magnitude higher than in naphthalene, anthracene, or pyrene, and the resultant reduction in triplet density makes tetracene particularly well-suited among crystalline materials for lasing. Band transport in crystalline materials further reduces singlet-triplet and singlet-polaron losses at low temperature, whereas field and thermally assisted hopping in amorphous materials freezes out triplet diffusion and retards charge transport as the temperature is decreased.

To calculate non-radiative losses in amorphous materials using Eq. (1), the concentration of polarons and triplets within an electrically-pumped device is estimated. The free charge within most undoped organic materials is negligible. Hence, current flow requires the injection of charge, and in the absence of injection barriers and charge traps, the current is space-charge-limited, i.e., $$J = \frac{9}{8}\mu\varepsilon\frac{V^2}{d^3},$$

where d is the film thickness, $\mu$ is the charge transport mobility, and $\varepsilon$ is the permittivity. In this case, the space charge density is:

$$n = \sqrt{\frac{J\varepsilon}{2\mu dq^2}}. \tag{3}$$

Equation (3) relates the minimum density of absorptive polarons (n) within an organic film to the charge transport mobility.

Although Eq. (3) gives the fundamental limit for a trap-free semiconducting organic film, OLEDs are often electron injection-limited, leading to additional surface charge, $\sigma$, accumulating at the interface between the organic semiconductor layers and the injecting contact. The most efficient OLEDs employ a heterostructure to force exciton formation and luminescence to occur far from the electrodes. This typically prevents charge from leaking through the device without first forming excitons, and provides spatial confinement of the excited states.

Figure 7B:
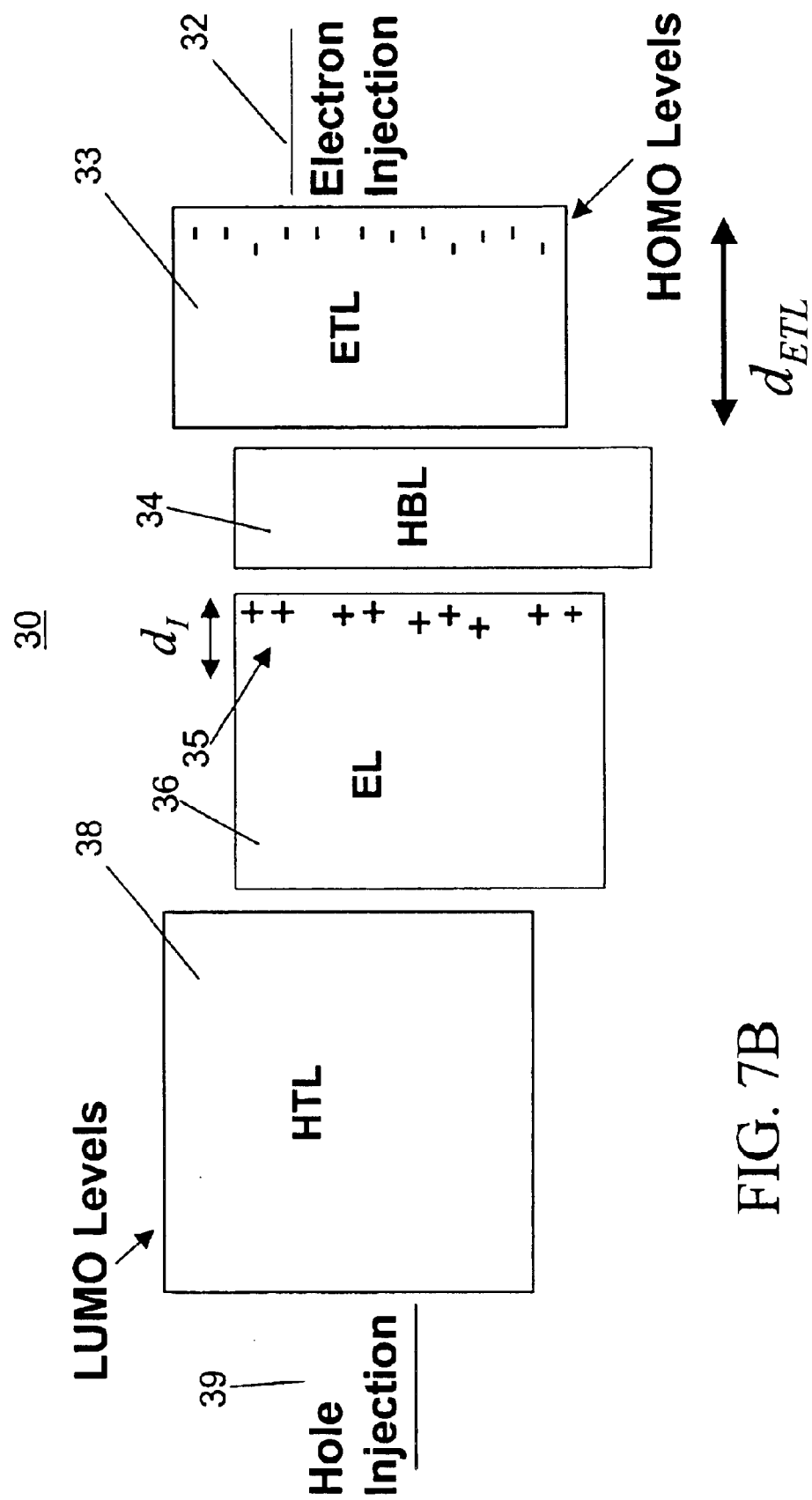
FIG. 7B illustrates energy levels in a typical organic light emitting device (OLED).

FIG. 7B illustrates energy levels in a typical OLED 30. As shown in FIG. 7B, OLED 30 can include an electron injection contact 32, an electron transport layer (ETL) 33, a hole blocking layer (HBL) 34, an emissive layer (EL) 36, a hole transport layer 38, and a hole injection contact 39. The electron energy levels are indicated by the lowest unoccupied molecular orbitals (LUMO), and those of holes are given by the highest occupied molecular orbitals (HOMO). The HOMO is determined from the ionization potential for each material referenced to vacuum, and the LUMO position is approximated by the difference of the ionization potential and the optical energy gap.

The ETL 33 can be a 300 Å thick layer of Alq$_3$, having a HOMO level of 5.8 eV and a LUMO level of 3.1 eV. The HBL 34 can be a 200 Å thick layer of BCP, having a HOMO level of 6.4 eV and a LUMO level of 2.9 eV. The EL 36 can be a 300 Å thick layer of 2% DCM2 in CBP, having a HOMO level of 6.0 eV and a LUMO level of 2.9 eV. The HTL 38 can be a 400 Å thick layer of $\alpha$-NPD, having a HOMO level of 5.4 eV and a LUMO level of 2.3 eV. The hole injecting contact 39 can be made of ITO and have an injection energy level of 4.7 eV.

In a conventional OLED 30, such as depicted in FIG. 7B, the surface charge (−) at the injection contact 32 is balanced by positive charge (+) that accumulates in the exciton formation region 35 proximate the interface between the emissive layer 36 and the hole blocking layer 34. The injection-limited charge is related to the applied voltage, V, by:

$$n = \frac{\varepsilon V}{q d_I d_{ETL}}, \quad (4)$$

where $d_{ETL}$ is the thickness of the electron transport layer, and the HTL/ETL interfacial charge is given by $\sigma = n d_I$, where $d_I$ is the thickness of the exciton formation zone.

Triplets are formed by the direct combination of electrons and holes, as well as via intersystem crossing from the singlet state. In fluorescent materials, triplets rarely luminesce, and the dominant decay paths are via non-radiative coupling to a vibronic excitation of the molecular ground state, triplet-triplet annihilation, and triplet-polaron quenching. Typically, triplets do not participate in long-range Förster energy transfer, so triplet-polaron quenching requires a collision between the species, and hence is much slower than singlet-polaron quenching.

Triplet-triplet annihilation is characterized by rate $\kappa_{TT}'$ following:

$$T^* + T^* \xrightarrow{\kappa_{TT}'} T^* + S \quad (5)$$

$$T^* + T^* \xrightarrow{\xi \kappa_{TT}'} S^* + S$$

where T* represents the excited triplet exciton. When two triplets collide, spin statistics determine the probability of singlet and triplet formation. It is often assumed that the generation rate of singlets from uncorrelated charges is $\frac{1}{3}$ that of triplets, i.e., $\xi = \frac{1}{3}$ and $8T^* \to 3T^* + S^* + 4S$.

Triplet-polaron (T*–P) quenching follows:

$$T^* + P \xrightarrow{\kappa_{TP}} S + P. \quad (6)$$

A typical rate, $\kappa_{TP}$, for triplet-polaron quenching in amorphous films is $1 \times 10^{-12}$ cm$^3$/s. Intersystem crossing is simply:

$$S^* \xrightarrow{k_{ISC}} T^*, \quad (7)$$

governed by the rate $k_{ISC}$.

Including all of these processes, the rate equation for the triplet exciton concentration, $N_T$, is:

$$\frac{dN_T}{dt} = -k_{NR}^T N_T - \kappa_{TP} n N_T - \kappa_{TT} N_T^2 + k_{ISC} N_S + \frac{1}{1+\xi} \frac{J}{qd_I}, \quad (8)$$

where $k_{NR}^T$ is the rate of non-radiative triplet decay, $N_S$ is the singlet density, q is the electronic charge, and the total loss rate of triplets is given by $\kappa_{TT} = (\frac{1}{2} + \xi) \kappa_{TT}'$.

Assuming that the rate of triplet generation from intersystem crossing is much less than the rate of electrical generation of triplets, i.e., ($k_{ISC}$ small), the transient solution to Eq. (8) is:

$$N_T(t) = \left(\frac{3J}{2qd_I(k_{NR}^T + \kappa_{TP}n)}\right) \frac{1 - \exp[-\Delta(k_{NR}^T - \kappa_{TP}n)t]}{(1+\Delta) - (1-\Delta)\exp[-\Delta(k_{NR}^T + \kappa_{TP}n)t]}, \quad (9)$$

where $$\Delta = \sqrt{1 + 3J\kappa_{TT}/qd_I(k_{NR}^T + \kappa_{TP}n)^2}$$

and $N_T = 0$ at time $t = 0$. At the low injection levels often used in OLEDs (i.e., $J \sim 1$ mA/cm$^2$), $\Delta \sim 1$, and Eq. (9) may be approximated by:

$$N_T = \frac{3J}{4qd_I k_{NR}^T}(1 - \exp[-k_{NR}^T t]). \quad (10)$$

For electrically-pumped lasing, much higher injection levels are expected, and it may be assumed that triplet losses from triplet-triplet and triplet-polaron annihilation are dominant. In this case, the steady state solution of Eq. (8) using Eq. (3) is:

$$N_T = \frac{\kappa_{TP}}{2\kappa_{TT}}\left(-1 + \sqrt{1 + \frac{6\kappa_{TT}\mu dq}{\kappa_{TP}^2 \varepsilon d_I}}\right)\sqrt{\frac{\varepsilon J}{2\mu dq^2}}. \quad (11)$$

The loss mechanisms for singlet excitons are singlet-triplet annihilation at rate, $\kappa_{ST}$:

$$T^* + S^* \xrightarrow{\kappa_{ST}} T^* + S, \quad (12)$$

singlet-singlet annihilation (see Eq. (2)), and singlet-polaron annihilation at rate, $\kappa_{SP}$:

$$S^* + P \xrightarrow{\kappa_{SP}} S + P. \quad (13)$$

The rate equation for singlet excitons is therefore:

$$\frac{dN_S}{dt} = -k_R N_S - k_{NR}^S N_S - k_{ISC} N_S - \kappa_{ST} N_S N_T - \quad (14)$$

$$\kappa_{SP} n N_S - \frac{1}{2}\kappa_{SS} N_S^2 + \frac{\xi}{1+2\xi}\kappa_{TT} N_T^2 + \frac{\xi}{1+\xi}\frac{J}{qd_I},$$

where $k_R$ is the radiative rate of singlet fluorescence, and $k_{NR}^S$ is the intrinsic non-radiative rate of singlets. The coupled pair of Eqs. (8) and (14) can be solved in steady-state to give the singlet density as a function of J. At very high singlet densities, Eq. (14) is dominated by singlet-singlet annihilation. Equations (3) and (11) demonstrate that triplets and polarons should increase with √J in electrically pumped lasers, and Eq. (14) indicates that singlet losses from singlet-singlet annihilation also increase with √J. Under these conditions, the steady state quantum efficiency may be expressed as:

$$\frac{\eta}{\eta_o} = \frac{J_0}{4J}\left(\sqrt{1+8\frac{J}{J_0}} - 1\right), \quad (15)$$

where $\eta_0$ is the quantum efficiency in the absence of singlet-singlet annihilation, and $$J_0 = \frac{4qd_l}{\kappa_{SS}\tau^2} \quad (16)$$

is the annihilation 'onset' current density at $\eta=\eta_0/2$.

When a potential is applied across an amorphous organic film, the resulting hole and electron currents typically vary substantially in magnitude, reducing the quantum efficiency of a single layer OLED. Unbalanced hole and electron currents may arise from differences in injection efficiency or charge transport mobility. By use of a heterostructure, however, it is possible to force balanced current flow by introducing barriers to the leakage of charge carriers out of the luminescent region. A heterostructure may be fabricated from a material that predominantly transports electrons, together with a material that predominantly transports holes. Alternatively, a large energy barrier at the heterointerface may retard the flow of either electrons or holes.

Efficiency losses that result from the breakdown of charge confinement in a heterostructure at high electric fields will now be examined. Electric field-induced losses from exciton dissociation have been studied previously in OLED materials. However, in a heterostructure device, charge confinement should force any dissociated charges to eventually re-form an exciton. In any case, the binding energy of most excitons in amorphous films of small molecular weight materials is ~1 eV (for example, the binding energy of an Alq$_3$ singlet is 1.4 eV). Thus, maintenance of charge confinement is fundamental to the efficient operation of an OLED.

Figure 8:
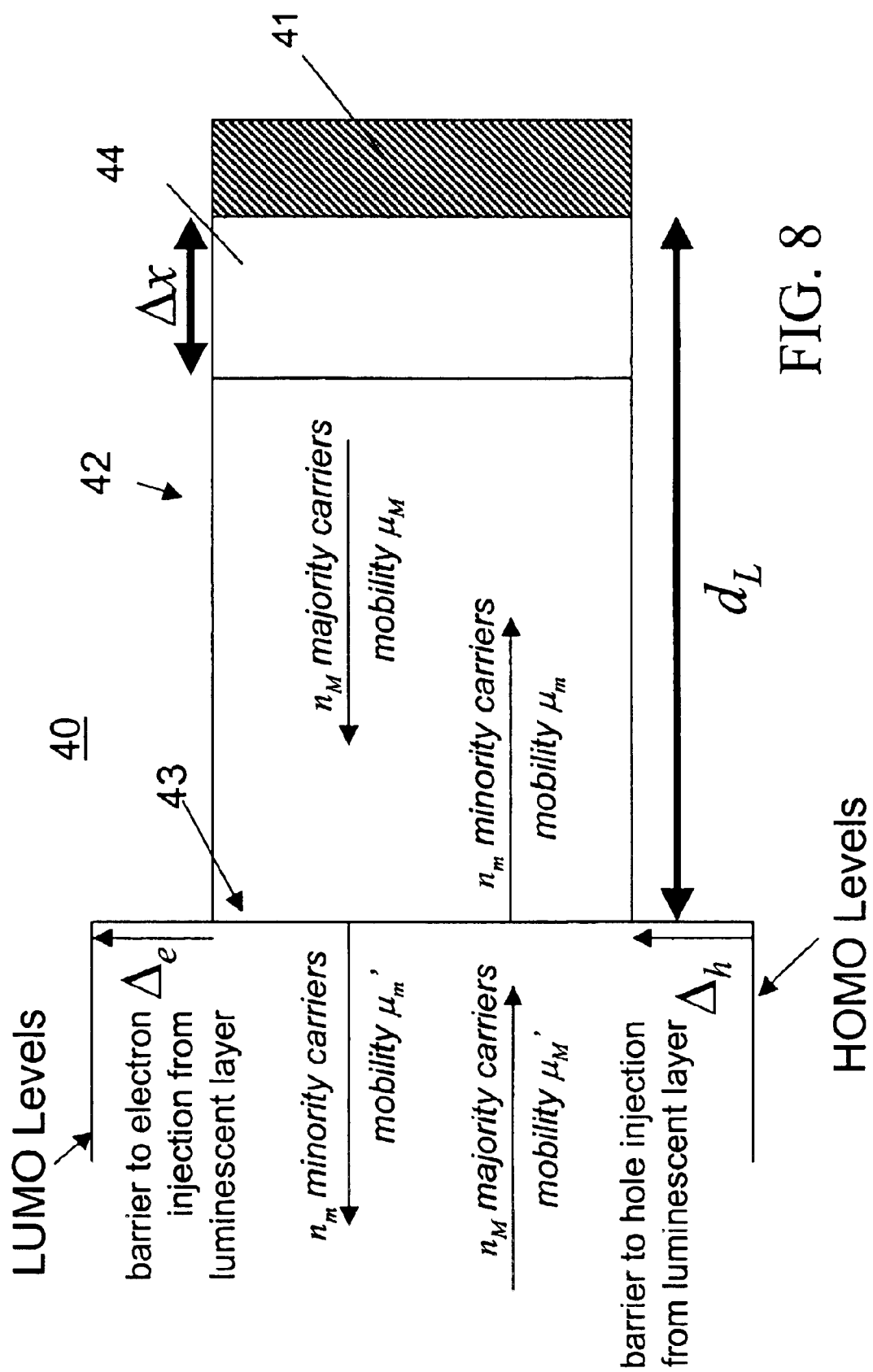
FIG. 8 depicts a luminescent layer in a heterostructure OLED.

The effect of high fields in structures that confine charges with a mobility gap is now examined. A luminescent layer in a heterostructure OLED that preferentially transports majority carriers with density, $n_M$, and mobility, $\mu_M$ is considered. FIG. 8 depicts such a heterostructure OLED 40 having an injection contact 41 and a luminescent layer 42. Preferential hole or electron transport is a property of materials with widely varying charge transport mobilities, i.e., a predominantly electron transporting material has $\mu_e \gg \mu_h$, where $\mu_e$ and $\mu_h$ are the electron and hole mobilities, respectively. The heterostructure 40 confines the majority carriers, but allows the injection of minority carriers, with density, $n_m$, and a mobility, $\mu_m$. An example is the archetypical Alq$_3$/N,N'-diphenyl-N,N'-bis(3-methylphenyl)-[1,1'-biphenyl]-4,4'-diamine (TPD) heterostructure OLED. TPD preferentially transports holes, and its small electron mobility forces exciton formation to occur in Alq$_3$. Electrons are preferentially transported in Alq$_3$, but holes can be injected from TPD, although they are in turn confined by the relatively small mobility of Alq$_3$.

To calculate losses within the heterostructure 40 shown schematically in FIG. 8, the dynamics of the minority carriers are described using:

$$\frac{dn_m}{dt} = -\kappa_L n_M n_m - \frac{\mu_m F}{d_L} n_m + \frac{J}{qd_L} \quad (17)$$

where the rate of electron-hole combination is commonly described by Langevin theory, viz. $\kappa_L = q(\mu_M + \mu_m)/\epsilon$, and F is the electric field. The luminescent layer 42, which has a thickness, $d_L$, extends from the heterostructure interface 43 to the injecting contact 41. It is assumed that, because of energy transfer to surface polarons and other non-radiative losses, all luminescence is quenched in a region 44 of thickness $\Delta x$ adjacent to the injecting contact 41. The second term in Eq. (17) is the residence time of a minority carrier, and the last term accounts for the flow of minority carriers into the luminescent layer under bias.

Current flow is space-charge limited at the very high injection levels required in organic lasers. Thus, under this model:

$$\frac{dn_m}{dx} = \frac{q(\mu_m + \mu_M)n_M}{\epsilon \mu_m F} n_m, \quad (18)$$

where x is the distance from the injecting contact 41. Assuming that the electric field close to the injecting contact 41 is determined by the majority carriers, that is, $$F = 2qn_M x/\epsilon, \quad (19)$$

the solution to Eq. (18) is:

$$\eta_C = 1 - [n_m(\Delta x)/n_m(d_L)] = 1 - [\Delta x/d_L]^{\frac{\mu_m + \mu_M}{2\mu_m}}, \quad (20)$$

where $\eta_C$ is the efficiency of charge confinement in the heterostructure, defined as the fraction of injected charges that form excitons. Since $\mu_M \gg \mu_m$, $\eta_C \sim 1$ in most heterostructure OLEDs. At high electric fields, $$\mu_m \to \mu_M, \text{ then } \eta_C \to \left(1 - \frac{\Delta x}{d_L}\right).$$

The thickness of the non-radiative region adjacent to the cathode is $\Delta x \sim 100$ Å, thus for a typical luminescent layer of thickness $d_L \sim 600$ Å, the minimum possible charge confinement efficiency is $\eta_C = 80\%$. This suggests that single-layer OLEDs are potentially very efficient if both carriers can be injected into the organic layers with similar efficiencies.

Energy barriers may also be used to confine charge carriers. However, since the interfacial energy barrier is typically $\Delta \sim 1$ eV, the electric field required to break charge confinement is $F = \Delta/\delta \sim 10^7$ V/cm, where the width of the interface, $\delta$, is taken to be 10 Å. This is similar to that required for dielectric breakdown and catastrophic failure of the device. Thus, field-induced non-radiative losses are not likely to dominate in a well-designed organic heterostructure.

The impact of non-radiative losses on the threshold of an electrically pumped organic laser will now be discussed. The internal quantum efficiency of fluorescence in the laser cavity is:

$$\eta_{INT} = \frac{k_R N_S}{J/qd_l} = \frac{k_R}{k_R + k_{NR}(T, J)}, \quad (21)$$

where $k_{NR}(T,J)$ is the aggregate rate of non-radiative singlet decay dependent on temperature (T), and current density. Typically, only a fraction, $\chi$, of the fluorescence is emitted externally, i.e., $\eta_{EXT} = \chi \eta_{INT}$. For example, in surface emitting OLEDs fabricated on flat glass substrates, only ~20% of photons are emitted in the forward, or viewing direction. The remainder is lost to waveguiding in the substrate, or by non-radiative coupling to surface plasmons at the metal/organic contact interfaces.

Now, the population density of singlets at the threshold of lasing is:

$$N_S^{TH} = \frac{8\pi n_r^2}{\Gamma g(\lambda)\lambda^2 k_R}\left(\alpha_0 - \frac{1}{L}\log(R)\right) = \frac{8\pi n_r^2}{\Gamma g(\lambda)\lambda^2 k_R}\alpha_T, \quad (22)$$

where $g(\lambda)$ is the normalized fluorescent spectrum of the laser dye, $n_r$ is the cavity refractive index, $\alpha_0$ is the optical absorption coefficient of the cavity at the lasing wavelength $\lambda_0$, L is the length of the cavity, R is the reflectivity of each mirror (both assumed equal for simplicity), $\Gamma$ is the optical confinement factor within the active layer, and $\alpha_T$ is the total cavity absorption coefficient. In organic electroluminescent devices, the thickness of the exciton formation zone, $d_f$~100 Å, is expected to be much less than the diameter of the optical mode. Hence, the optical confinement factor as $\Gamma = A_0 d_f$ can be approximated, allowing for the elimination of $d_f$ from the expression for the threshold current density (see Eq. (24) below). To a first approximation, therefore, the confinement factor is independent of the charge transport properties of the organic materials. Improvements in $\Gamma$ may be achieved by increasing the refractive index of the laser waveguide. Combining Eqs. (21) and (22) then gives:

$$\gamma = \frac{\eta_{INT} J}{q d_f} \frac{\Gamma \lambda^4}{8\pi n_r^2 c \Delta \lambda} \quad (23)$$

$$\eta_{EXT} J_{TH} > \chi \frac{8\pi n_r^2 q c \Delta \lambda}{A_0 \lambda^4}\left(\alpha_0 - \frac{1}{L}\log(R)\right), \quad (24)$$

where $\gamma$ is the maximum optical gain (i.e., in the absence of absorption and mirror losses), and $J_{TH}$ is the threshold current density. The normalized spectrum at the lasing frequency has been approximated by $$g(\lambda_0) \approx \frac{\lambda_0^2}{c \Delta \lambda}.$$

Here $\Delta \lambda$ is the spectral width of the laser dye.

Values of the laser operating parameters for a molecular solid are typified by the dye DCM2, with $\lambda_0$~650 nm, $\Delta\lambda$~70 nm, and $k_R$~2×10$^8$s$^{-1}$. Thus, it follows from Eq. (22) that electrically-pumped lasing typically requires $$N_S^{TH} > 4 \times 10^{15} (\alpha_T / \Gamma) \text{ cm}^{-3}.$$

Kozlov, et al. have measured $\alpha_0 = (27\pm4)$ cm$^{-1}$ in an electrically-pumped structure consisting of 200 Å thick ITO cathodes and anodes, enclosing organic layers with a total thickness of 1000 Å (see V. G. Kozlov, G. Parthasarathy, P. E. Burrows, et al., IEEE J. Quantum Electron. 36, 18 (2000)). For a cavity length of L=1 mm, and using the organic/air interface as a reflecting surface (giving R~7%), a mirror loss of $$-\frac{1}{L}\log(R) = 27 \text{ cm}^{-1}$$

is obtained, resulting in a total loss of $\alpha_T=(54\pm4)$ cm$^{-1}$. This does not include non-radiative losses, which are included in the quantum efficiency, $\eta$, in Eqs. (23) and (24). For a typical laser structure with a 1000 Å thick organic layer of refractive index $n_r$=1.72, and a 2% DCM2:Alq$_3$ active region of refractive index $n_r$=1.78, the confinement factor within the organic structure is $\Gamma$=40%, giving $A_0$=4×10$^4$ cm$^{-1}$.

Furthermore, for typical surface emitting OLEDs the output coupling fraction, $\chi$, is approximately 0.2. The minimum external quantum efficiency-threshold current density product is then $\eta_{EXT} J_{TH}$>40 A/cm$^2$, which defines the performance required of an electroluminescent material if it is to be considered for use in an electrically-pumped laser. That is, for a typical external fluorescent quantum efficiency of $\eta_{EXT}$=2%, the required threshold current density for a Fabry-Perot laser is $J_{TH}$=2 kA/cm$^2$. It is expected that this value of $J_{TH}$ is achievable in high-mobility crystalline materials such as tetracene.

Figure 9A:
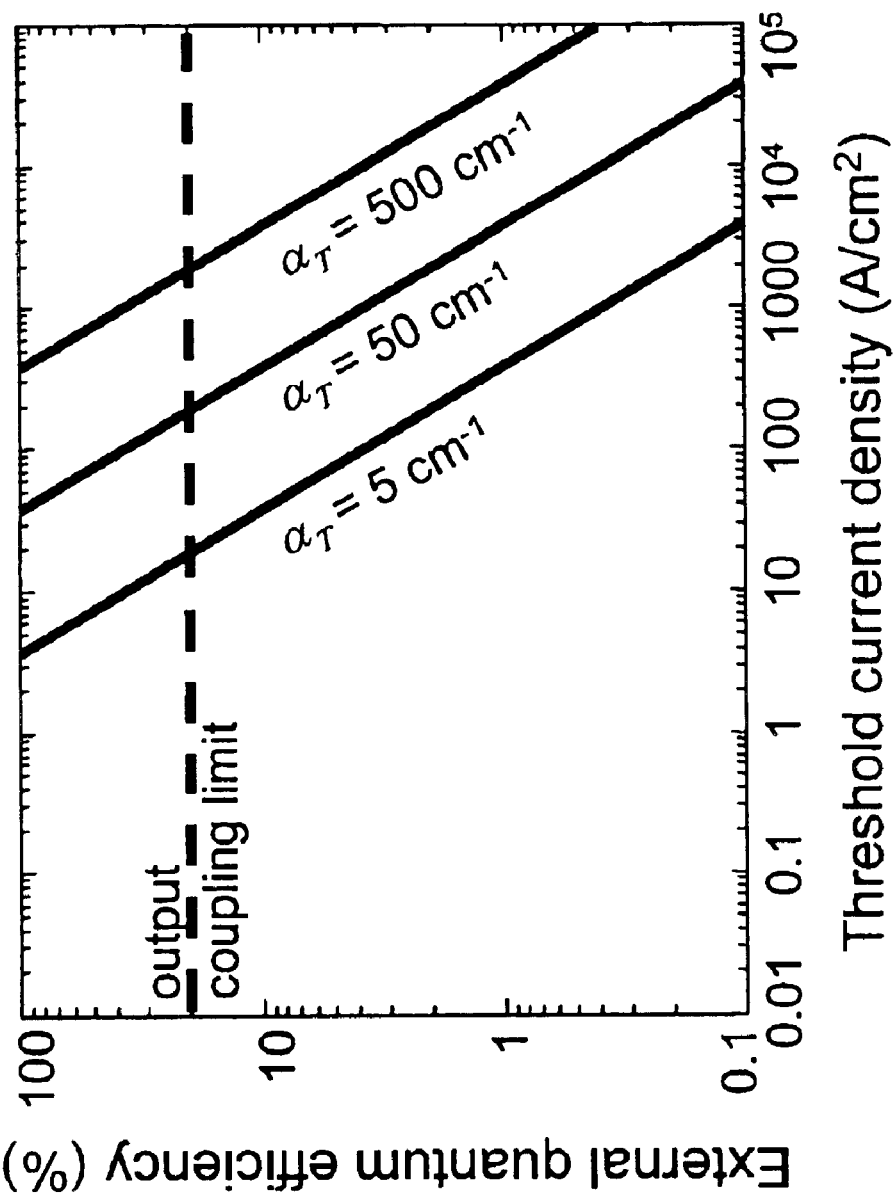
FIG. 9A summarizes the analysis of a quantum efficiency-threshold current density product.
Figure 9B:
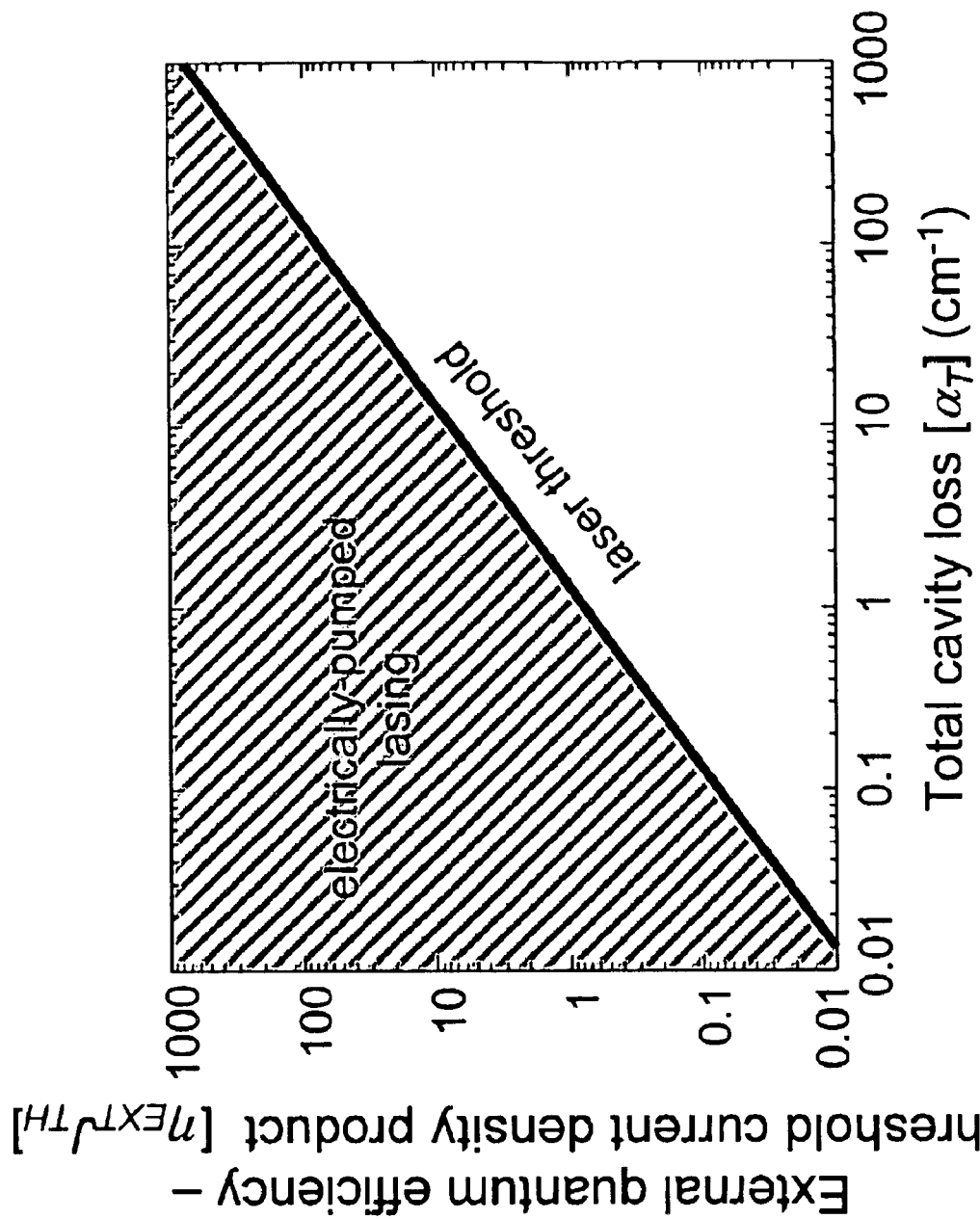
FIG. 9B is a plot of minimum quantum efficiency-threshold as a function of cavity loss.

FIGS. 9A and 9B summarize the analysis of a quantum efficiency-threshold current density product. FIG. 9A is a plot of external quantum efficiency as a function of threshold current density. The upper bound to efficiency is the output coupling fraction, $\chi$~0.2, since an external efficiency of $\eta_{EXT}$20% corresponds to a device with 100% internal quantum efficiency. The additional polaron absorption induced by electrical excitation should also be considered, although it is noted that lasing materials that possess efficiencies that are relatively independent of current density are also not likely to exhibit significant polaron absorption since the process of singlet-polaron annihilation is closely related. At a current density of J=100 A/cm$^2$, Kozlov, et al. found that the absorption of a DCM2:Alq$_3$ device increased to $\alpha_T$=400 cm$^{-1}$, increasing the threshold to $\eta_{EXT} J_{TH}$=300 A/cm$^2$. It can be shown that DCM2 also exhibits strong singlet-polaron annihilation, in agreement with the expected link with polaron absorption.

Alternately, it is possible to design a distributed feedback laser where the mirror loss is nearly zero. For a material system without polaron absorption, it is conceivable that the cavity loss may be as low as $\alpha_T$~5 cm$^{-1}$. Indeed, in an optically pumped laser, cavity losses as low as $\alpha_T$~1 cm$^{-1}$ have been demonstrated. Thus, in FIG. 9A, $J_{TH}$ is shown for several values of cavity loss: $\alpha_T$=5 cm$^{-1}$, 50cm$^{-1}$, and 500 cm$^{-1}$.

In FIG. 9B, the minimum quantum efficiency-threshold current density product is plotted as a function of cavity loss. Under the most favorable conditions of low loss, high optical confinement, and high quantum efficiency, $\eta_{EXT}$→5%, threshold currents as low as 50 A/cm$^2$ may be sufficient for electrically-pumped lasing in small molecule, polymeric, and crystalline films.

To understand the effects of non-radiative losses in electrically-pumped amorphous thin films, an archetype guest-host system consisting of 2% DCM2 in 4,4'-N,N'-dicarbazole-biphenyl (CBP) was studied. As discussed above, the rate of singlet-polaron quenching is determined by the overlap between the singlet fluorescence and polaron absorption spectra. In a film of DCM2:CBP, there is overlap between CBP fluorescence and DCM2 absorption, and the Förster radius for singlet transfer is R~30 Å. Consequently, there is likely to be strong absorption and quenching of CBP singlets by DCM2 polarons, which may preferentially accumulate on DCM2 rather than CBP because of the narrower energy gap of DCM2.

Electrical pumping of DCM2:CBP can be achieved by incorporating it as the emissive layer of an OLED, and in FIG. 7B the proposed energy levels for the device are depicted. Organic layers were deposited by high-vacuum (10$^{-6}$ Torr) thermal evaporation onto a cleaned glass substrate precoated with transparent, conductive ITO. A 400-Å-thick layer of 4,4'-bis[N-(1-napthyl)-N-phenyl-amino] biphenyl ($\alpha$-NPD) was used to transport holes to the luminescent layer consisting of either CBP, or 2% DCM2 in CBP. A 300-Å-thick layer of Alq$_3$ was used to transport electrons into the emissive layer, and to reduce DCM2 luminescence absorption at the cathode. A thin (e.g., 200-Å) barrier layer of 2,9-dimethyl-4,7-diphenyl-1,10-phenanthroline (bathocuproine, or BCP) was used to confine holes and excitons within the luminescent DCM2:CBP layer.

From an analysis of the behavior of $Alq_3$/metal contacts, it has been determined that transport in $Alq_3$ is injection limited by electron trapping at the $Alq_3$/metal interface. To maintain charge neutrality, the corresponding positive charge is constrained by the hole blocking layer of BCP at the CBP/BCP interface. Thus, the OLED structure of FIG. 7B maximizes singlet-polaron quenching within the luminescent layer. For simplicity, both the potential required to inject and transport holes, and the built-in potential of the device, are neglected. The distance, $d_{ETL}$, separating the two charged layers is assumed to determine the total voltage across the device.

The density of the interfacial charge can be adjusted by varying the injection properties of the cathode. Hence, OLEDs were fabricated using three different cathode materials: LiF/Al, Mg:Ag and Al. The LiF/Al cathode possesses the most efficient electron-injecting characteristics, having a 5-Å-thick layer of LiF capped with a 1000-Å-thick layer of Al deposited through a shadow mask with 1 mm diameter openings. Magnesium-silver cathodes are the next most efficient electron injectors. They included a 1000-Å-thick layer of 25:1 Mg:Ag, with a 500-Å-thick Ag cap. Cathodes having only a single, 1000-Å-thick layer of Al were also used. These required the largest voltage to achieve a given current density, and consequently they maximize the density of charge at the CBP/BCP interface. Due to injection-limited transport and the large density of charge in the emissive layer, it is expected that singlet-polaron quenching should be much greater than singlet-triplet quenching and singlet-singlet annihilation. Thus, the $N_S^2$ can be neglected, as can the triplet terms in Eq. (14). The quantum efficiency can therefore be fit to:

$$\eta_{EXT} = \frac{\eta_0}{1 + \kappa_{SP}\tau\varepsilon/qd_l(V/d_{ETL})} \quad (25)$$

where $\tau$ is the exciton lifetime $$(\tau^{-1} = k_R + k_{NR}^S + k_{ISC}),$$

and the unquenched quantum efficiency is $$\eta_0 = \chi k_R / (k_R + k_{NR}^S + k_{ISC}).$$

As $V_{ETL} \to 0$, the quantum efficiency (i.e., $\eta_0$) may not be meaningful, and should be used merely as a scaling parameter.

To the inventors' knowledge, the crystalline organic material, tetracene, is the first organic material to show gain under electrical pumping. In the structure of Schön, et al. shown in FIG. 7A, charge is injected using dual thin film transistors that allow both hole and electron currents to be individually tuned. When a small potential is placed across the device, hole and electron currents are injected into the bulk, forming excitons. A Fabry-Perot cavity can be formed perpendicular to the cross section of FIG. 7A by cleaving the crystal. The gate length of the thin film transistors is 25 μm, and the cavity length is approximately 750 μm. The thickness of the crystal is approximately 2–10 μm.

The five unambiguous characteristics of lasing according to Kozlov, et al. are: (1) a clear indication of a threshold in output energy as a function of input energy, with a high lasing efficiency above threshold; (2) strong output beam polarization in confined cavities; (3) spatial coherence (as indicated by a diffraction-limited output beam or speckle);

(4) significant spectral line narrowing; and (5) the existence of laser cavity resonances, or modes (see V. G. Kozlov, V. Bulovic, P. E. Burrows, and S. R. Forrest, Nature 389, 362 (1997)). The device of Schön et al. shows strong evidence for optical gain, as demonstrated by significant spectral line narrowing ($\Delta\lambda \sim 2.5$ Å at $J=2000$ A/cm$^2$ and $T=5K$). There is also evidence of Fabry-Perot resonances in the tetracene spectrum, although such weak resonances are frequently observed below threshold in conventional semiconductor lasers. However, the threshold is not well defined, no evidence of a beam is presented, and most importantly, the slope efficiency is only $\sim 10^{-4}$, apparently confirming that the device is operating below threshold at both $T=5K$ and $T=300K$. The poor slope efficiency indicates that an extremely small fraction of the injected charge is contributing to electroluminescence emerging from the facets. These observations suggest that the device of Schön et al. is a superluminescent OLED.

The operation of the tetracene device will now be analyzed in detail. Non-radiative losses are considered first, and it is found that singlet-singlet annihilation leads to significant reductions in efficiency at high injection levels. Tetracene also has a relatively poor photoluminescent efficiency of $\sim 0.15$ at room temperature, and the maximum quantum efficiency-current density product achieved at $T=5K$ is $\eta_{EXT}J=0.3$ A/cm$^2$. Even if consideration is made for incomplete collection of the electroluminescence in the reported results, this appears to be considerably less than that required for lasing in a practical structure. Finally, the tetracene device of FIG. 7A lacks charge and optical confinement, two important requirements for achieving lasing in semiconducting materials. Thus, the clear observation of spectral narrowing in tetracene is remarkable, as it suggests that lasing could be achievable in an optimized structure. The origins of the spectral narrowing must therefore be resolved. The following analysis suggests that electrical confinement at interfaces may promote nonlinear effects such as self focusing, or the formation of an electron hole plasma. These processes can lead to substantial optical gain or lasing in optimized structures, such as those described above in connection with FIGS. 2–6.

Figure 10A:
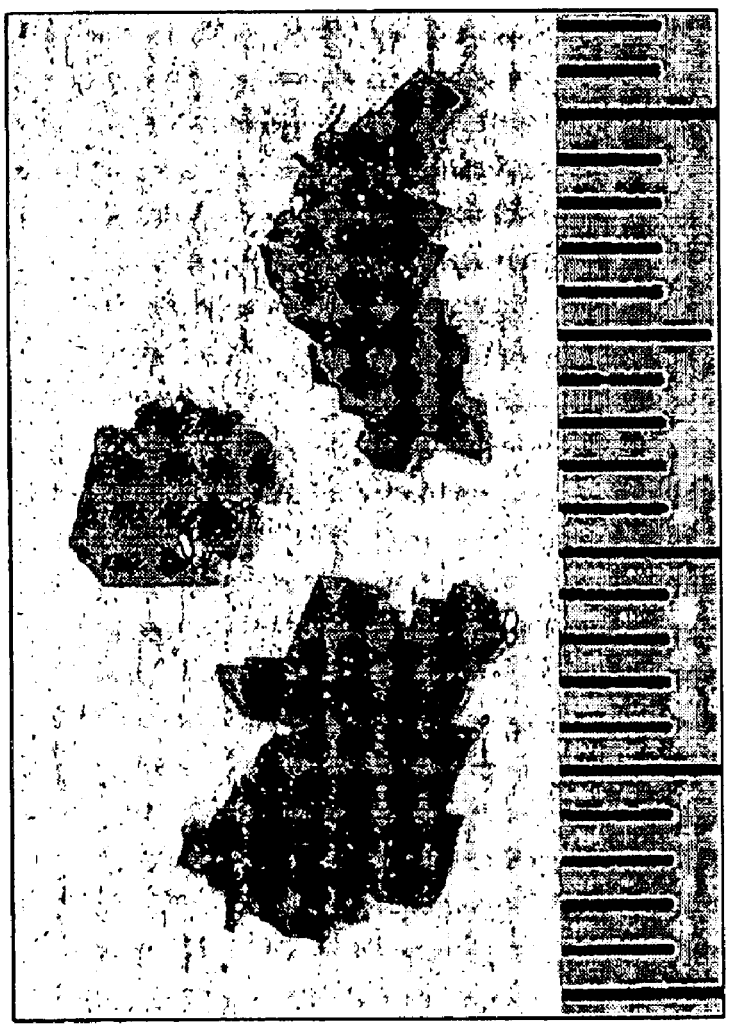
FIG. 10A depicts a typical tetracene crystal grown at atmospheric pressure in argon.
Figure 10B:
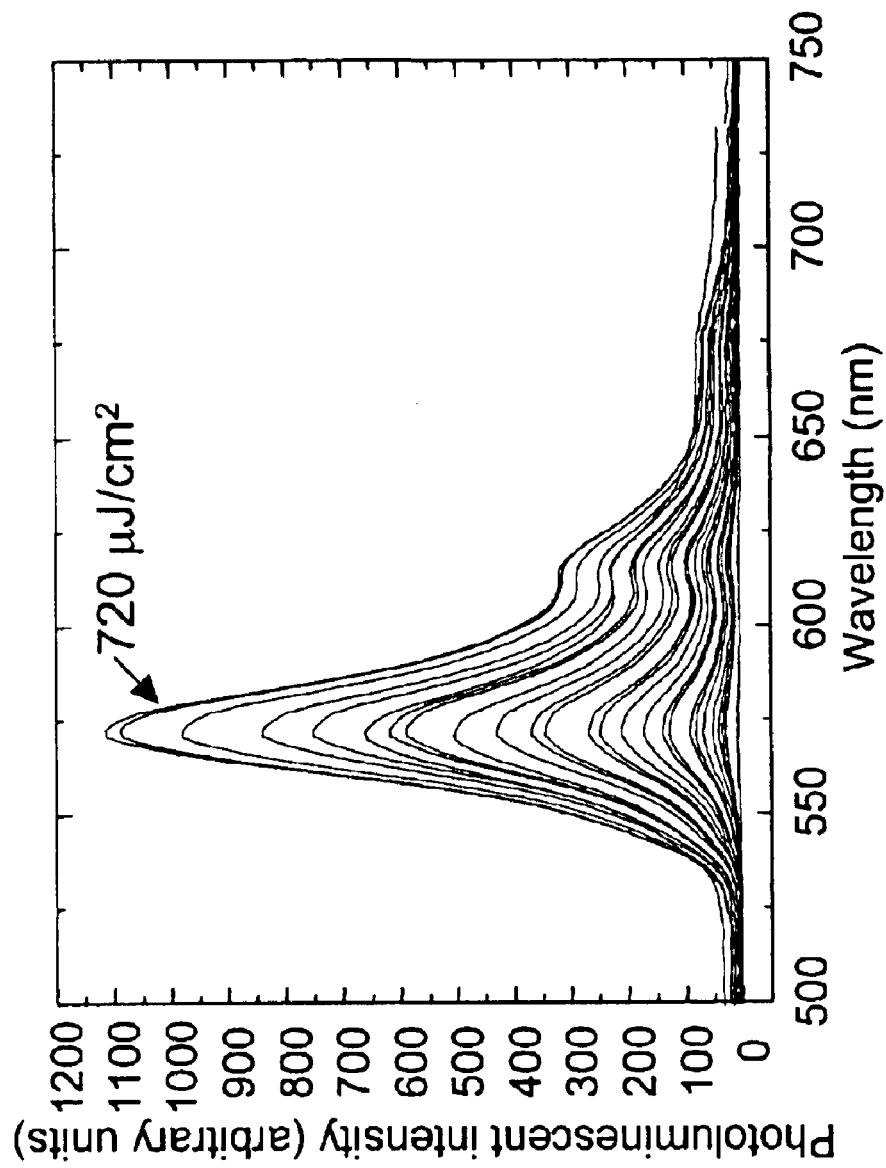
FIG. 10B is a plot of photoluminescent intensity as a function of wavelength.

For optical characterization, tetracene crystals were grown at atmospheric pressure in argon following the technique of Kloc, et al. (see C. Kloc, P. Simpkins, T. Siegrist, and R. Laudise, J. Cryst. Growth 182, 416 (1997)). FIG. 10A depicts a typical crystal that is approximately 10 μm-thick by 1 cm long. To determine the effect of non-radiative losses, the relative quantum yield was measured by optically exciting a single crystal with a nitrogen laser. The pump laser generated 1 ns-pulses at a wavelength of $\lambda=337$ nm with a peak energy density of 720 μJ/cm$^2$ when focused to a 1 mm-diameter circular spot. Given 90% absorption within the crystal, it is estimated that singlet densities as high as $10^{16}$ cm$^{-3}$ are generated at the highest pump laser fluence. For a circular pump beam, a cavity can be formed between the parallel top and bottom crystal facets. The beam was also shaped in a $\sim 10$ mm×0.5 mm stripe using a cylindrical lens, forming a continuous gain-guided cavity across the length of a crystal with two parallel facets oriented normal to the beam direction. The facet reflectivities in both geometries were $\sim 8\%$, similar to that in the structure of FIG. 7A. The spectra in both orientations were identical, and as shown in FIG. 10B, which is a plot of photoluminescent intensity as a function of wavelength. No significant narrowing or threshold in intensity was observed in the photoluminescent spectrum of tetracene for estimated singlet densities of $N_S \leq 10^{16}$ cm$^{-3}$.

Figure 11:
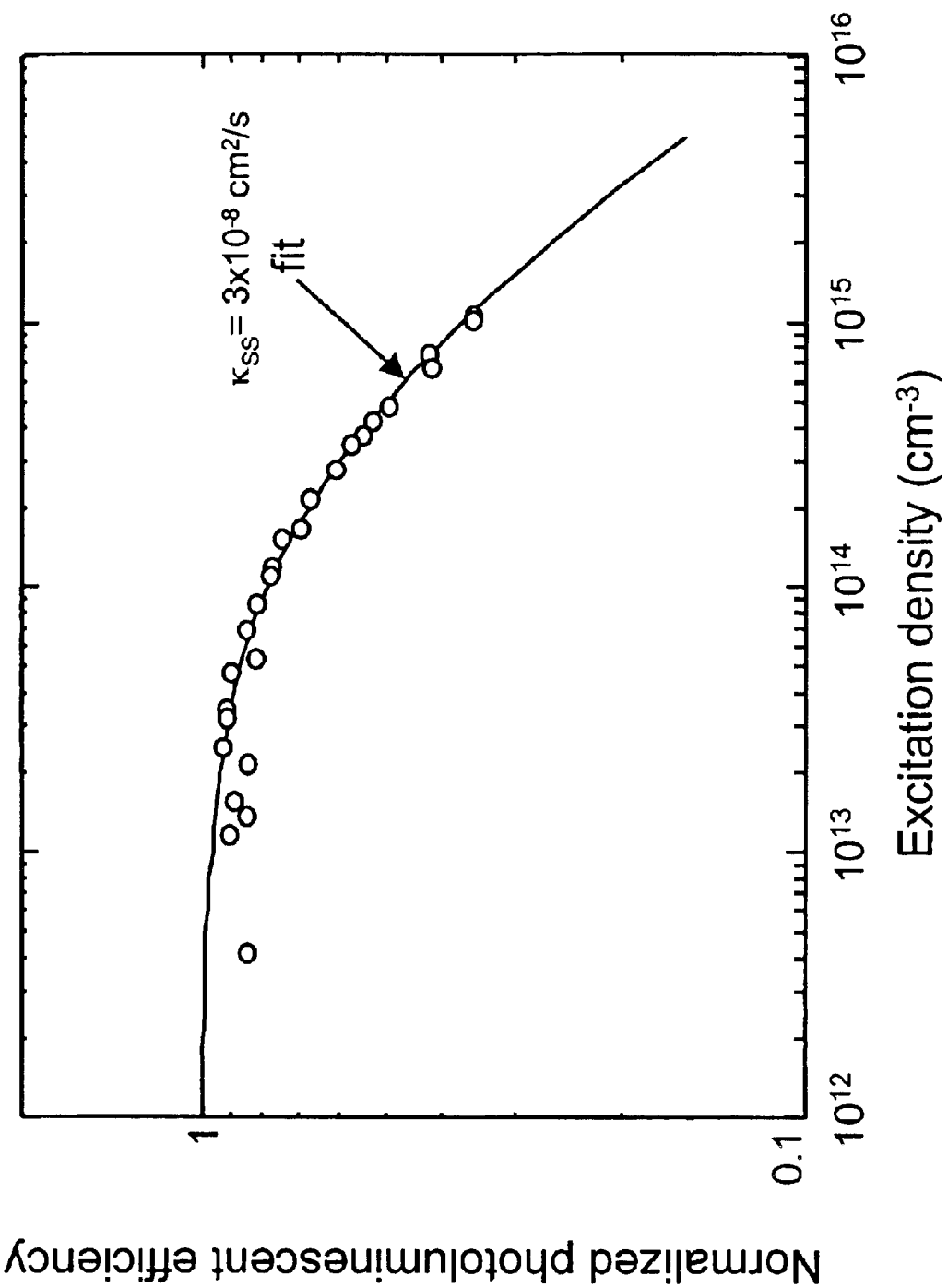
FIG. 11 is a plot of normalized photoluminescent efficiency as a function of excitation density.

The normalized photoluminescent efficiency as a function of $N_S$ is shown in FIG. 11. In agreement with previous studies, the efficiency is found to decrease at high excitation densities. This has been attributed to singlet-singlet annihilation (see Eqs. (2) and (14)). From a fit to these data (shown as a solid line in FIG. 11), it is found that $\kappa_{SS}=3\times10^{-8}$ cm$^2$/s, which is also in agreement with previous studies.

Figure 12:
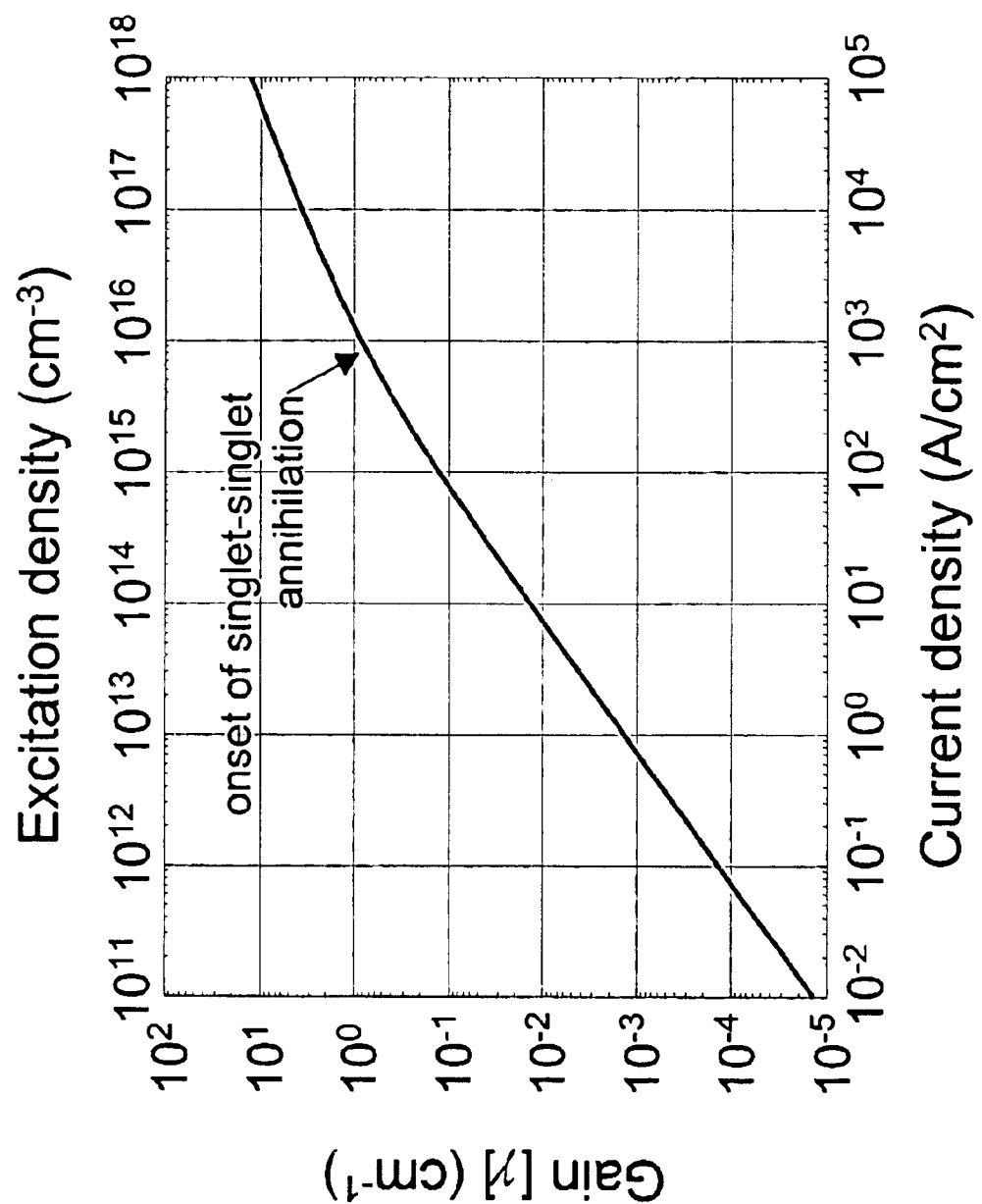
FIG. 12 is a plot of optical gain as a function of excitation density and current density.

The impact of singlet-singlet annihilation on optical gain in tetracene is described by the external quantum efficiency-current density product, calculated from Eqs. (23) and (24). At low temperature it is assumed that the internal quantum efficiency is limited only by spin statistics ($\xi/(1+\xi)=0.25$). At room temperature, however, the photoluminescent efficiency of tetracene ($\eta_{PL}=0.15$) is also included. That is, in Eq. (15), $\eta_0=\eta_{PL}\xi/(1+\xi)$. The optical gain is then calculated as a function of singlet density, $N_S$, and current density, J, as shown in FIG. 12 for a crystal thickness of 10 µm. At inversion densities of $N_S\sim10^{16}$ cm$^{-3}$, singlet-singlet annihilation reduces the expected optical gain to $\gamma\sim0.8$ cm$^{-1}$. It is likely, therefore, that the lack of spectral narrowing observed in FIG. 10B is due to waveguide and other residual absorption losses exceeding the relatively small maximum optical gain.

For a tetracene crystal of 10 µm thickness, the current density corresponding to an inversion density required for an optical gain of $\gamma\leq1$ cm$^{-1}$ is J~1000 A/cm$^2$. Given the expected mirror losses in the device of Schön, et al. of $\alpha\sim30$ cm$^{-1}$, the lasing in the bulk tetracene crystal requires at least $J_{TH}\sim100$ kA/cm$^2$.

The actual location of the recombination zone in the device of Schön, et al. is unclear. Since the injection efficiencies of both positive and negative carriers are independently tuned by adjusting the gate voltages, a misalignment in charge transport or injection can swing the exciton formation region to either of the tetracene/aluminum oxide interfaces. These interfaces provide two-dimensional carrier confinement, possibly reducing the rate of singlet-singlet annihilation. Furthermore, the high densities of interfacial charge (~$10^{13}$ cm$^{-2}$) should locally reduce the refractive index of tetracene.

Figure 13A:
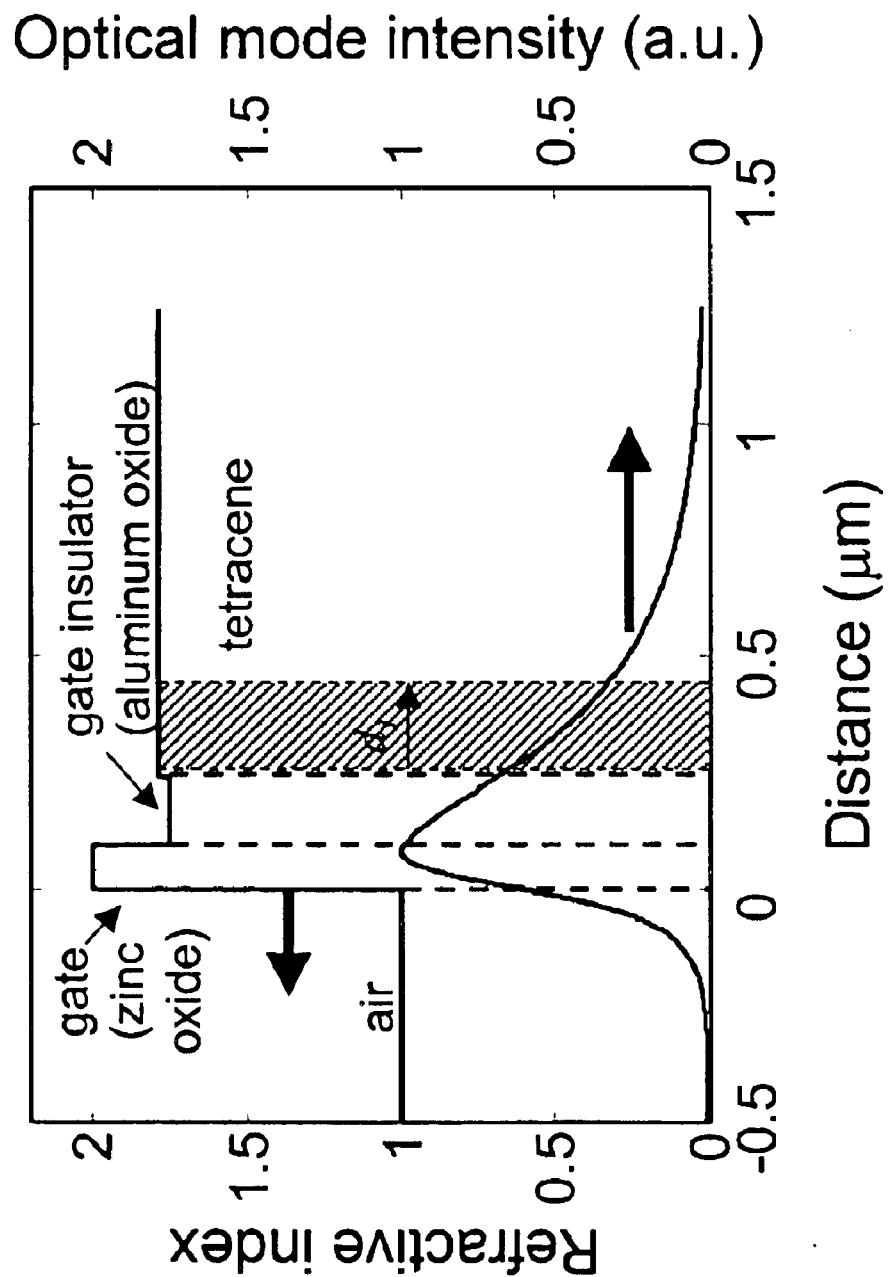
FIG. 13A depicts confinement of an optical mode within a high index gate oxide.

FIG. 13A depicts confinement of an optical mode within a high index gate oxide. In FIG. 13A it is shown that a single optical mode may be confined within the high index gate oxide if the tetracene refractive index is reduced to $n_r\sim1.80$. Thus, rather than causing anti-guiding, it is possible that high charge densities at the tetracene interface may help to establish optical confinement near a gate electrode. Because this mode leaks significantly into the organic gain medium, the combination of a higher confinement factor, $\Gamma$, and localized reduction of singlet-singlet annihilation may lower the threshold current density required for lasing.

Figure 13B:
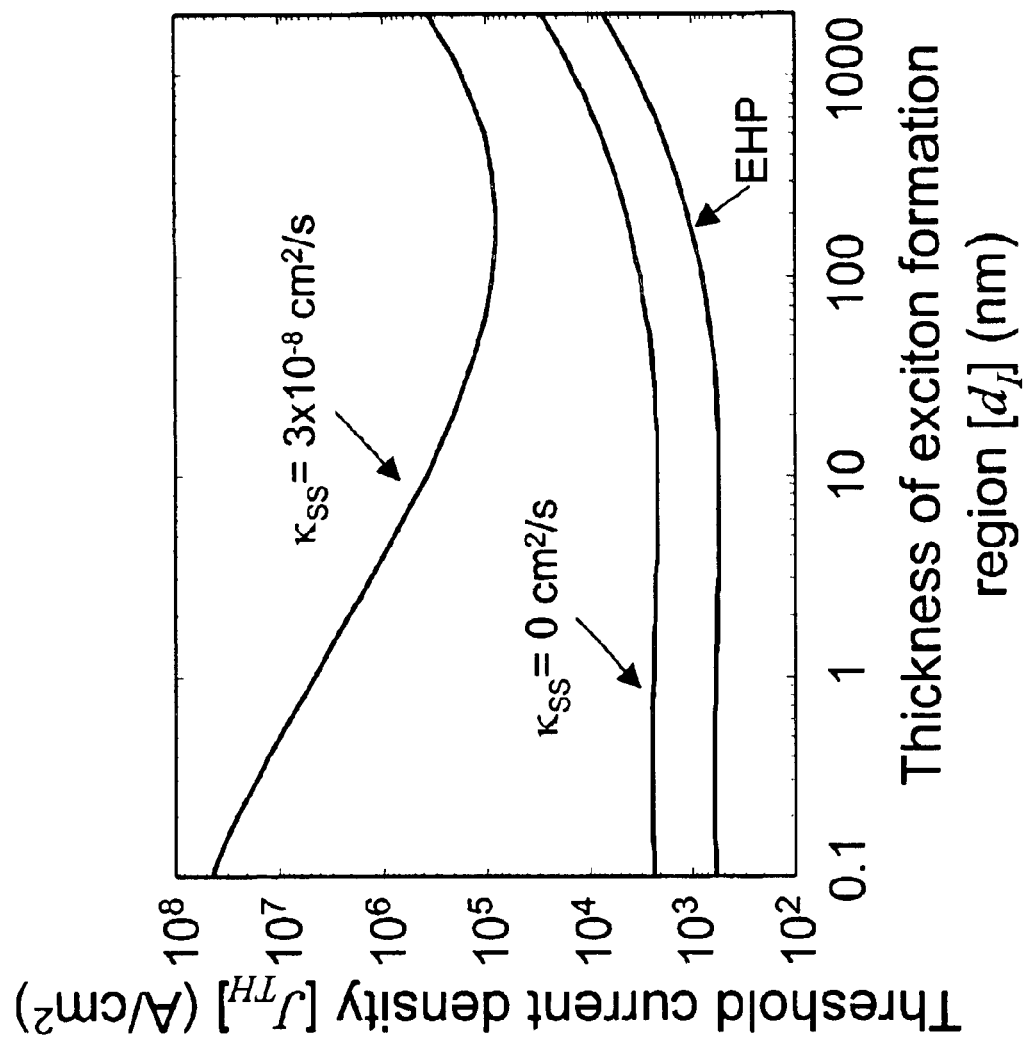
FIG. 13B is a plot of threshold current density as a function of thickness of an exciton formation region.

Such a situation is shown in FIG. 13B, which is a plot of threshold current density as a function of thickness of an exciton formation region. In the plot shown in FIG. 13B, combined mirror and absorption losses of $\alpha_T=60$ cm$^{-1}$ have been assumed. The minimum threshold current density is $J_{TH}>2$ kA/cm$^2$. Although this result is obtained in the absence of singlet-singlet annihilation, it is too high to explain the spectral narrowing observed in the device of Schön, et al.

As it was determined that there is insufficient structural electrical and optical confinement in the tetracene device of Schön, et al. to explain the observed spectral narrowing, two other potential extrinsic effects which may contribute to this phenomenon are now considered. The first effect is the formation of an electron hole plasma (EHP), which can be caused by extremely high densities of charges and excitons created by electrical confinement near an interface. The critical density of electron hole pairs, $n_p^c$, required for formation of an EBP is given approximately by:

$$a_B^3 n_p^c \approx 1, \tag{26}$$

where $a_B$ is the Bohr radius of the charge pairs. For organic materials, the exciton is often no larger than a molecular diameter.

At $V_G\sim50$V, the interfacial charge density in the exciton formation zone is $10^{13}$ cm$^{-2}$, and it is estimated that the density of charges may approach the density of molecular sites. Under these conditions, free carriers screen the Coulomb interactions within the excitons themselves. In addition, phase space filling of the bands at the interface excludes some electronic states required to complete excitonic wavefunctions. Phase space filling is generally marked by a relative increase in luminescence from the blue, unfilled, transitions in the vibronic manifold and it may account for the appearance of gain from the 1-0 transition in tetracene. Both screening by free carriers and phase space filling prevent exciton formation, and lead to the creation of an EHP. The exciton density required for the formation of an EHP is related to the size of the excitons (see Eq. (26)). Consequently, for an organic molecular crystal such as tetracene with localized excitons, the transition at the pumping levels employed in the device of Schön, et al. would be expected, i.e., as the density of excitons and charges approaches the density of molecular sites.

One consequence of the formation of an EHP is the disappearance of the quasi-particle nature of discrete excitons. This, in turn, eliminates many excitonic processes such as singlet-singlet annihilation and spin-selective radiative recombination in favor of direct band-to-band recombination at the interface, or other region (such as that surrounding a defect) where excitons and carriers would localize at high densities. Indeed, the absence of laser emission at even the highest exciton densities generated by optical pumping (see FIG. 10B, where $n<<n_p^c$) suggests that free carriers rather than excitons are the source of the spectral narrowing in the device of Schön, et al.

It is expected that singlet-singlet annihilation will be replaced by non-radiative Auger processes in the EHP, but the latter loss mechanisms may have a lower probability due to phase space filling. Thus, in FIG. 13B, the expected threshold current density is plotted given that $\kappa_{SS}=0$ and that the ratio of radiative states to free electrons is equal to unity, which is characteristic of free carriers occupying band-like states. The minimum threshold current density for lasing is found to closely approach that observed by Schön, et al., i.e., $J_{TH}=500$ A/cm$^2$.

The effects of the high density EHP may be reinforced by optical confinement introduced by a second nonlinear effect: self-focusing due to intensity-dependent saturation of the anomalous dispersion. To estimate the strength of this effect, it is noted that the refractive index, $n_r$, in a homogeneously broadened system such as tetracene is related to the optical gain by:

$$\delta n_r \approx -\frac{n_r}{k}\frac{\omega_0-\omega}{\Delta\omega}\frac{\gamma}{1+I/I_S} \tag{27}$$

$$\delta n_r(I) \approx -\frac{n_r\gamma}{k}\frac{\omega_0-\omega}{\Delta\omega}I/I_S,$$

where $\omega_0$ is the angular frequency of the radiative transition of tetracene, $\Delta\omega$ is the spectral width, and $I_S$ is the saturation optical intensity:

$$I_S = \frac{8\pi n_r^2 hc^2 \Delta\lambda}{\eta_{PL}\lambda_0^5}. \tag{28}$$

Thus, the refractive index increases with the laser intensity, and given sufficient light intensity, tetracene spontaneous emission may form its own waveguide.

In conventional semiconductor lasers, saturation dependent self-focusing below threshold is usually overwhelmed by the plasma effect. The lack of carrier confinement in the tetracene bulk should minimize anti-guiding because the carrier density within the crystal may be quite uniform. In any case, the plasma effect is expected to be weaker in organic materials than conventional semiconductor laser materials.

From Eq. (28), the saturation intensity in tetracene is approximately 3.3 $MW/cm^{-2}$, well above the expected intensity within the laser cavity if the excitons are uniformly distributed. But the saturation intensity may be realized at dislocations within the tetracene crystal. For example, if excitons are trapped within dislocations of area ~10 nm×100 nm, the saturation power is reduced to 33 $\mu$W. If optical confinement, $\Gamma \rightarrow 0.1$, within an exciton formation region of thickness, $d_f$~10 nm, then the current density at the lasing threshold is approximately $J_{TH}$=1000 $A/cm^2$, which is consistent with the current density required for the spectral narrowing observed by Schön, et al.

The agreement of the expected threshold current with the result of Schön, et al. suggests that high density EHPs and optical confinement aided, in part, by self focusing at defects or at the strained $Al_2O_3$/tetracene interface, may be the source of the observed gain and spectral narrowing.

Both crystalline and amorphous organic devices suffer from non-radiative losses. The physical deterioration of the amorphous CBP/BCP device discussed above limits the maximum quantum efficiency-current density product to $\eta_{EXT}J$=0.06 A/cm2. It is likely that this can be corrected by using a more stable materials combination. A reasonable estimate is $\eta_{EXT}$=0.02 at J=40 $A/cm^2$, giving $\eta_{EXT}J$~1 $A/cm^2$, corresponding to a peak output power of 1 $W/cm^2$, and similar to that required for lasing in an optimized structure (i.e., where $\alpha_T$=1 $cm^{-1}$). The maximum quantum efficiency-current density product of the crystalline tetracene device is similar, at $\eta_{EXT}J$=0.3 $A/cm^2$. Consequently, it is not immediately obvious that crystalline materials offer any significant advantages over amorphous organic semiconductors as lasing materials, and considering the processing advantages of amorphous materials, electrically-pumped amorphous materials may deserve further attention.

However, an intriguing possibility raised by the work of Schön, et al. is the formation of electron hole plasmas in crystalline materials under sufficient pumping densities. As described above, it is difficult to account for the observation of spectral narrowing in tetracene without explaining the apparent absence of singlet-singlet annihilation. Phase space filling in an EHP may reduce this loss pathway, and ionization of excitons will eliminate the formation of non-radiative triplet states. This appears to be the most likely explanation for the results of Schön, et al. Although both crystalline and amorphous materials could conceivably host an EHP, the excitation strength required for its formation is related to the size of an exciton by Eq. (26). Amorphous materials possess the most highly localized Frenkel excitons that may ultimately discourage formation of an EBP. In the absence of a technique for minimizing non-radiative losses in amorphous materials, a potential thin film lasing structure must be designed for very low cavity losses, i.e., $\alpha_T \rightarrow 1$ $cm^{-1}$. Thicker, doped transport layers can be used to separate the luminescent region from absorptive injection contacts. Alternatively, the transport layers in a double heterostructure might be fabricated from crystalline or poly-crystalline materials for improved charge transport mobility. Injection limited transport can be overcome by thin film transistor injection contacts such as those employed by Schön, et al.

The fabrication of such a cavity is challenging to current organic technologies, and in any case, it is possible that polaron absorption will increase at high current densities. Thus, alternative strategies may need to be developed for an all-organic, amorphous, electrically pumped laser. For example, an optimal threshold current might be obtained by separating the pump and gain regions altogether, using an OLED to optically pump a low loss organic laser. This approach minimizes non-radiative losses and increases flexibility in the design of the laser cavity. Given current OLED quantum efficiency-current density products, some focusing of the pump will be required by the structure. But the fabrication of a 'flashlamp' organic laser would be a significant first step towards a practical, amorphous, organic laser.

Thus, there have been described organic light emitting devices having compositions and geometries that are suitable for the formation of an EHP within an organic layer of the device. Those skilled in the art will appreciate that numerous changes and modifications can be made to the preferred embodiments of the invention, and that such changes and modifications can be made without departing from the spirit of the invention. It is intended, therefore, that the appended claims cover all such equivalent variations as fall within the true spirit and scope of the invention.

What is claimed is:

1. A light emitting device, comprising:
    an organic layer;
    a first electrical contact that is adapted to inject electrons into the organic layer; and
    a second electrical contact that is adapted to inject holes into the organic layer, such that an electron-hole plasma is formed within the organic layer.

2. The device of claim 1, wherein the formation of the electron hole plasma causes the organic layer to emit laser light.

3. The device of claim 2, wherein the first contact is disposed on a first portion of the organic layer, the second contact is disposed on a second portion of the organic layer, and an optical mode of the laser light is generally confined in a third portion of the organic layer between the first portion of the organic layer and the second portion of the organic layer.

4. The device of claim 3, wherein
    the third portion of the organic layer has an effective index of refraction,
    the first portion of the organic layer has an effective index of refraction that is less than the effective index of refraction of the third portion of the organic layer, and
    the second portion of the organic layer has an effective index of refraction that is less than the effective index of refraction of the third portion of the organic layer.

5. The device of claim 1, wherein
    the organic layer has a nominal index of refraction, and
    the organic layer is disposed on a substrate that has a nominal index of refraction that is less than the nominal index of refraction of the organic layer.

6. The device of claim 1, wherein
    the organic layer has a nominal index of refraction, and
    the device further comprises a first insulating layer disposed on at least a portion of the organic layer, the first insulating layer having a nominal index of refraction that is greater than the nominal index of refraction of the organic layer.

7. The device of claim 6, further comprising a second insulating layer disposed on the first insulating layer,
    wherein the second insulating layer has a nominal index of refraction that is less than the nominal index of refraction of the first insulating layer.

8. The device of claim 6, further comprising a gate contact disposed on the first insulating layer.

9. The device of claim 7, further comprising a gate contact disposed on the second insulating layer.

10. The device of claim 2, further comprising an optical resonator that confines an optical mode of the light within the organic layer.

11. The device of claim 2, wherein
the organic layer is disposed on a substrate, between a pair of gratings in the substrate that form an optical resonator that confines an optical mode of the light within the organic layer.

12. The device of claim 2, further comprising:
an insulating layer disposed on at least a portion of the organic layer, wherein the insulating layer includes a grating that forms an optical resonator that confines an optical mode of the light within the organic layer.

13. The device of claim 1, wherein the organic layer has a band gap and a nominal index of refraction, and the organic layer is disposed on a layer of high band-gap material having a band-gap that is higher than the band gap of the organic layer and a nominal index of refraction that is less than the nominal index of refraction of the organic layer.

14. The device of claim 13, wherein each of organic layer and the high band gap material has a respective energy level of highest occupied molecular orbitals (HOMO) and lowest unoccupied molecular orbitals (LUMO), and wherein the HOMO of the high bad gap layer is higher than the HOMO of the organic layer and the LUMO of the high bad gap layer is lower than the LUMO of the organic layer.

15. The device of claim 1, wherein the organic layer comprises at least one of CBP, tris-(8-hydroxyquinoline) aluminum, a polyacene, a phthalocyanine, a porphyrin, and a conducting polymer.

16. The device of claim 15, wherein the polyacene is one of tetracene, pentacene, and anthracene.

17. The device of claim 15, wherein the conducting polymer is a small molecule polymer.

18. The device of claim 15, wherein the conducting polymer is one of PPV, PVK, MEH-PPV.

19. The device of claim 1, wherein at least one of the first and second electrical contacts comprises at least one of indium-tin oxide, aluminum, silver, lithium fluoride/aluminum, magnesium/silver, platinum, and gold.

20. The device of claim 1, wherein the first contact and the second contact are made of different materials.

21. The device of claim 1, wherein the first contact made of a low work function metal and the second contact is made of a high work function metal.

22. The device of claim 5, wherein the substrate comprises at least one of plastic, glass, silicon, and silicon oxide.

23. The device of claim 6, wherein the insulating layer comprises $TiO_2$.

24. The device of claim 7, wherein the first insulating layer comprises $TiO_2$, and the second insulating layer comprises at least one of silicon oxide and silicon nitride.

25. The device of claim 13, wherein the high band-gap material comprises polytetrafluoroethylene.

26. The device of claim 1, wherein the device emits laser light in a first direction, an optical mode of the laser light is optically confined in a second direction that is generally perpendicular to the first direction, and the laser light resonates in a third direction that is generally parallel to the first direction.

27. The device of claim 1, wherein the electron-hole plasma is formed based on electrical confinement of charge carriers within a lasing region of the device.

28. The device of claim 1, wherein the organic layer has an external quantum efficiency-current density product of at least about 5 $A/cm^2$.

29. The device of claim 1, wherein a density of electron-hole pairs is achieved within the organic layer that is greater than approximately $1/a_B^3$, where $a_B$ is the Bohr radius of the electron-hole pairs.

30. A light emitting device, comprising:
an organic layer; and
means for optically confining an optical mode of light within a lasing region of the device such that the organic layer lases when an electron-hole plasma is formed within the organic layer.

31. A light emitting device, comprising:
an organic layer; and
means for electrically confining charge carriers within a lasing region of the device, such that the organic layer lases when an electron-hole plasma is formed within the organic layer.

32. A light emitting device, comprising:
an organic layer; and
means for resonating light within a lasing region of the device, such that the organic layer lases when an electron-hole plasma is formed within the organic layer.

* * * * *